United States Patent
Kim et al.

(10) Patent No.: US 8,610,208 B2
(45) Date of Patent: Dec. 17, 2013

(54) SEMICONDUCTOR DEVICE

(75) Inventors: Yongdon Kim, Hwaseong-si (KR); Eungkyu Lee, Seoul (KR); Sungryoul Bae, Hwaseong-si (KR); Soobang Kim, Seoul (KR); Dong-Eun Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 321 days.

(21) Appl. No.: 13/183,548

(22) Filed: Jul. 15, 2011

(65) Prior Publication Data

US 2012/0037986 A1  Feb. 16, 2012

(30) Foreign Application Priority Data

Aug. 11, 2010  (KR) .................. 10-2010-0077474

(51) Int. Cl.
*H01L 29/78*  (2006.01)

(52) U.S. Cl.
USPC ...... 257/336; 257/379; 257/528; 257/E21.24; 257/E21.38

(58) Field of Classification Search
USPC ............ 257/336, 379, 528, E21.24, 139, 141, 257/E21.38
See application file for complete search history.

(56) References Cited

U.S. PATENT DOCUMENTS

| 5,869,850 A | 2/1999 | Endo et al. |
| 8,421,157 B2 * | 4/2013 | Hatade .......................... 257/370 |
| 2009/0001424 A1 * | 1/2009 | Cao et al. ....................... 257/200 |
| 2009/0101990 A1 | 4/2009 | Kang et al. |

FOREIGN PATENT DOCUMENTS

| KR | 1020040090575 | 10/2004 |
| KR | 1020090032709 A | 4/2009 |

* cited by examiner

*Primary Examiner* — Cathy N Lam
(74) *Attorney, Agent, or Firm* — Volentine & Whitt, PLLC

(57) ABSTRACT

A semiconductor device includes a body region of a first conductivity type and a gate pattern disposed on the body region. The gate pattern has a linear portion extending in a first direction and having a uniform width and a bending portion extending from one end of the linear portion. The portion of a channel region located beneath the bending portion constitutes a channel whose length is greater than the length of the channel constituted by the portion of the channel region located beneath the linear portion.

18 Claims, 30 Drawing Sheets

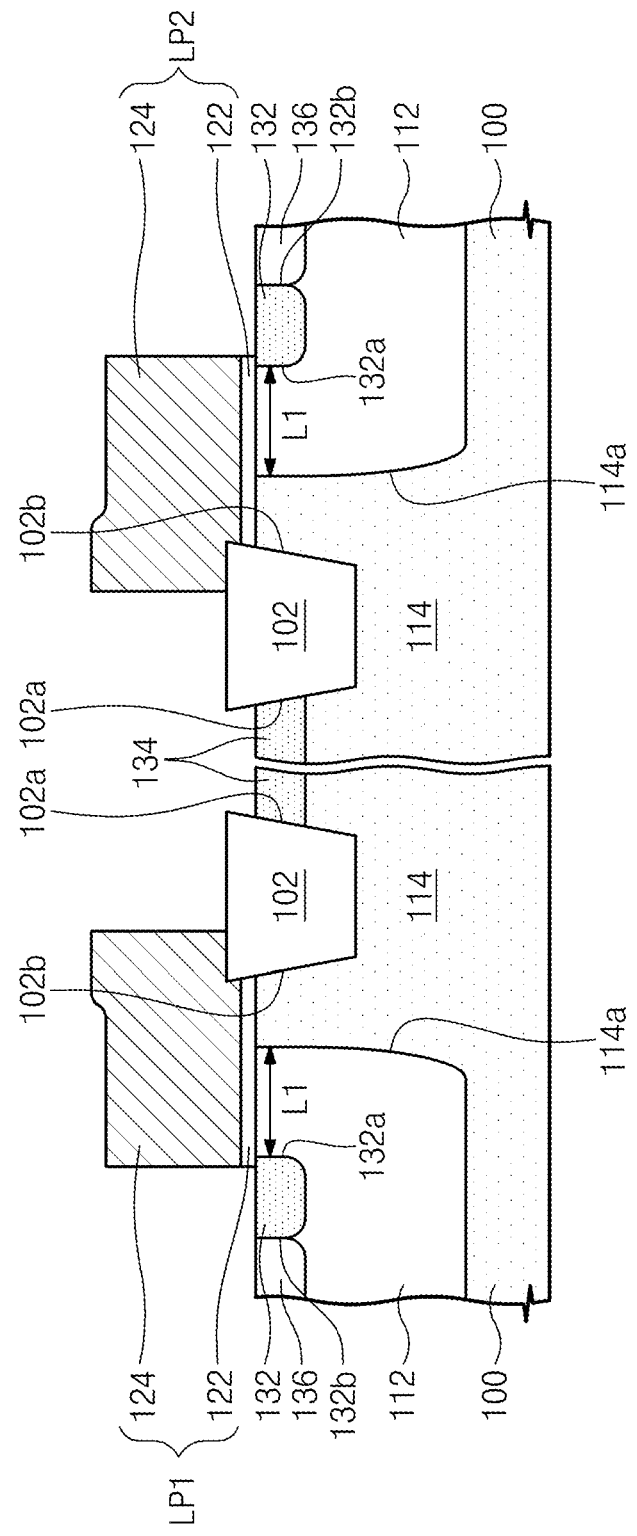

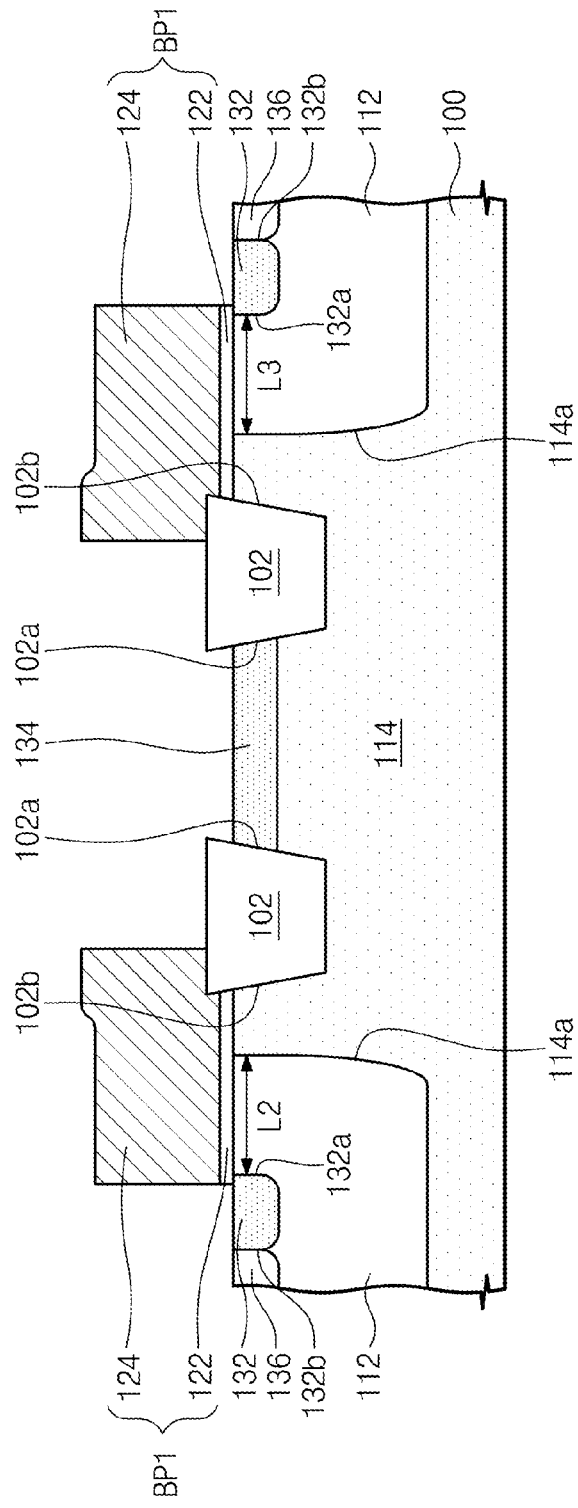

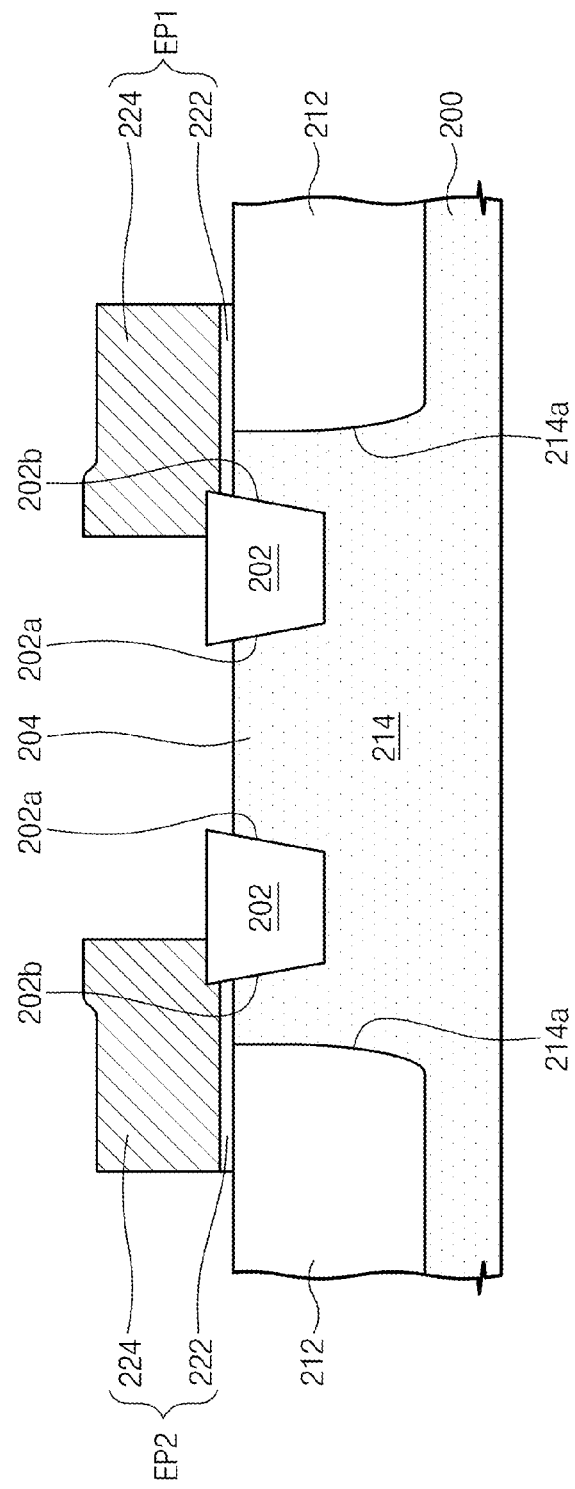

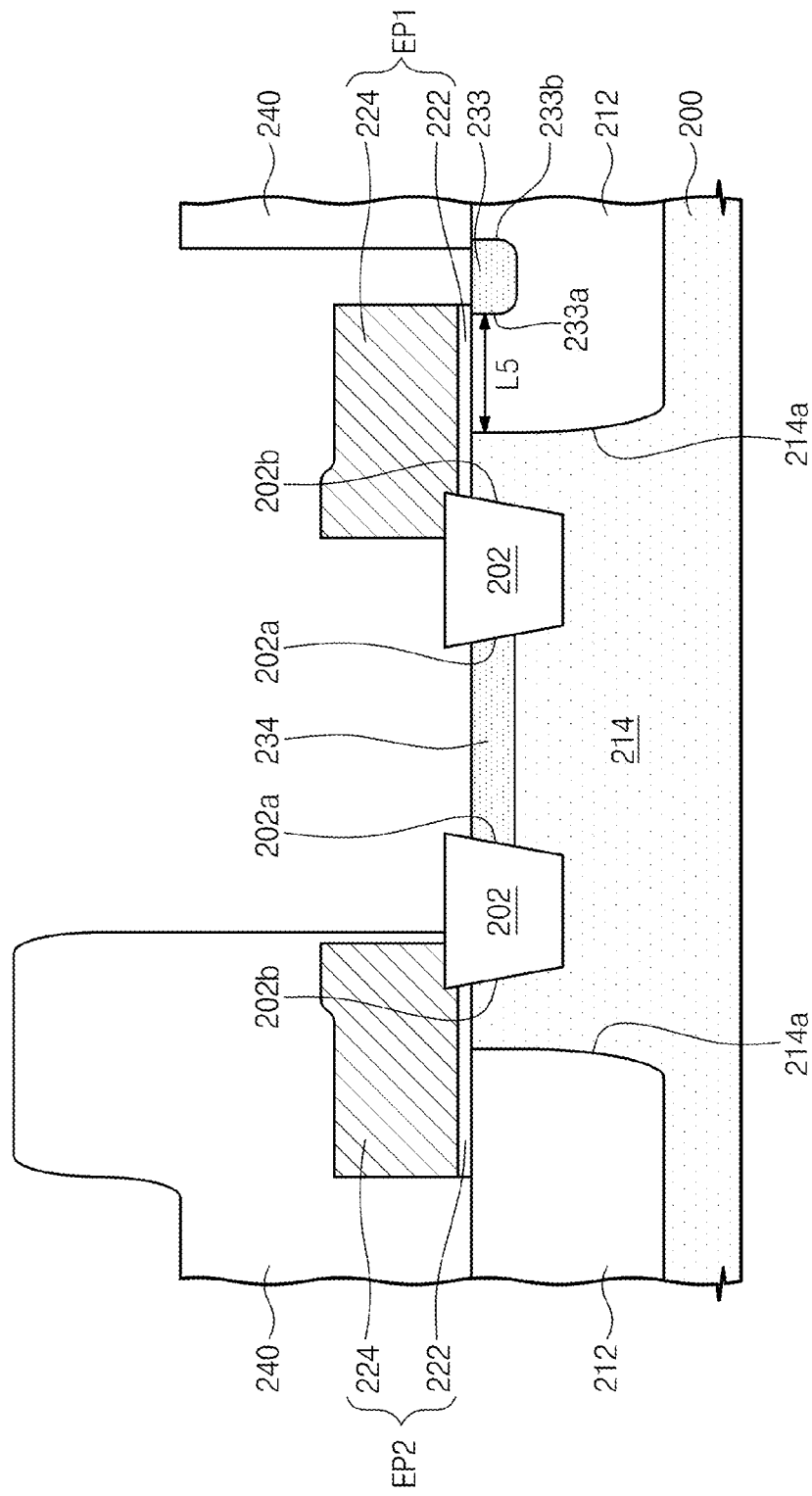

SEMICONDUCTOR DEVICE

CROSS-REFERENCE TO RELATED APPLICATION(S)

This U.S. non-provisional patent application claims priority under 35 U.S.C. §119 of Korean Patent Application No. 10-2010-0077474, filed on Aug. 11, 2010.

BACKGROUND

The inventive concept relates to a MOS device having a loop-shaped gate structure. The inventive concept also relates to lateral high voltage transistors such as laterally diffused metal oxide semiconductor (LDMOS) transistors.

In an example of a MOS device, doped regions of a substrate serve as source and drain regions, a loop-shaped gate structure extends around one of the doped regions and is located on the semiconductor substrate between the source and drain regions, and the channel region is a region of the substrate located under the gate structure. Thus, the channel region has linear portions and bend portions. Furthermore, an isolation structure may isolate one of the doped regions. In this case, the gate structure surrounds at least part of the isolations structure. In a laterally diffused metal oxide semiconductor (LDMOS) device, a drift region is provided between the channel region and the drain region.

SUMMARY

There is provided a semiconductor device having a gate pattern that includes both a linear portion and a bending portion and in which a length of the channel of the device beneath the bending portion is greater than the length of the channel beneath the linear portion.

According to one aspect, a body region of a first conductivity type is provided in a substrate. The gate pattern is disposed on the body region. The linear portion of the gate pattern extends longitudinally, i.e., is elongated, in a first direction in an X-Y plane. The linear portion has a uniform width. The bending portion extends from one end of the linear portion and bends from the first direction in the X-Y plane. A channel region is a region of the device located beneath the gate pattern and the channel of the device is formed in the channel region. Thus, with respect to a first portion of the channel region located beneath the linear portion of the gate pattern, the channel of the semiconductor device has a first length (corresponding to the width of the first portion of the channel region). In this case, therefore, the width of the first portion of the channel region is the dimension thereof in a second direction perpendicular to the first direction in the X-Y plane. The channel of the semiconductor device has a second length in a second portion of the channel region located beneath the bending portion of the gate pattern. Thus, the second length corresponds to the width of the second portion of the channel region at one point. In this case, therefore, the width of the second portion of the channel region is the dimension thereof in a direction different from each of the first and second directions in the X-Y plane. The second channel length is greater than the first channel length.

According to another aspect, a body region is provided in a substrate and delimits a drift region, a first source/drain region is disposed in the body region, and the gate pattern disposed on the body region between the drift region and the first source/drain region. The body region is of a first conductivity type, the drift region is part of the substrate surrounded by the body region and is of a second conductivity type, the first source/drain region is of the second conductivity type, the gate pattern has a linear portion of uniform width extending longitudinally in a first direction in an X-Y plane and a bending portion extending from one end of the linear portion and bending from the first direction in the X-Y plane, and the shortest distance between the drift region and a first part of the first source/drain region adjacent to the line portion is smaller than the shortest distance between the drift region and a second part of the first source/drain region adjacent to the bending portion.

According to still another aspect, a drift region of one conductivity type, first and second source/drain regions of the same conductivity type, and a body region of the other conductivity type are provided in the substrate. The second source/drain region is elongated in a first direction in an X-Y plane, and the body region surrounds and delimits the drift region. A device isolation layer of insulating material is disposed in the drift region of the substrate and extends in a loop in the X-Y plane around the second source/drain region. Part of the body region is interposed between the first source/drain region and the device isolation layer as laterally spaced outwardly from the device isolation layer, and extends in a loop in the X-Y plane around the device isolation layer. Therefore, part of the drift region spans the loop-shaped part of the body region and the device isolation layer. Furthermore, a gate pattern is disposed on the substrate. The gate pattern has the shape of a loop in the X-Y plane and includes linear portions extending adjacent opposite sides of the second source/drain region, respectively, and bending portions extending adjacent opposite ends of the second source/drain region, respectively. The gate pattern covers the loop-shaped part of the body region, and that part of the drift region which spans the loop-shaped part of the body region and the device isolation layer. The linear portions of the gate pattern have uniform widths. Furthermore, each of the bending portions have widths at points therealong that are greater than the widths of the linear portions such that the gate pattern spans, in its widthwise direction, the loop-shaped part of the body region to a greater extent at points along the bending portion than at any point along the linear portions.

BRIEF DESCRIPTION OF THE DRAWINGS

The above and other aspects and feature of the inventive concepts will become apparent from the detailed description that follows, with reference to the accompanying drawings, in which:

FIG. 1B is a sectional view of the first embodiment of the semiconductor device taken along line I-I' of FIG. 1A.

FIG. 1C is a sectional view of the first embodiment of the semiconductor device taken along line II-II' of FIG. 1A.

FIGS. 2A through 5C illustrate a method of manufacturing a semiconductor device in accordance with the inventive concept, in which FIGS. 2A through 5A are plan views, FIGS. 2B through 5B are sectional views taken along the lines I-I' of FIGS. 2A through 5A, respectively, and FIGS. 2C through 5C are sectional views taken along the lines II-II' of FIGS. 2A through 5A respectively.

FIGS. 7A through 8C illustrate a method of manufacturing the second embodiment of a semiconductor device, in accordance with of the inventive concept and in which FIGS. 7A and 8A are plan views, FIGS. 7C and 8C are sectional views taken along lines IV-IV' of FIGS. 7A and 8A, respectively.

FIGS. 10A through 10C illustrate a method of manufacturing this other version of the second embodiment of a semiconductor device, in accordance with the inventive concept, in which FIG. 10A is a plan view, FIG. 10B and is a sectional view taken along lines V-V of FIG. 10A, and FIG. 10B is a sectional view taken along line VI-VI' of FIG. 10A.

DETAILED DESCRIPTION OF THE EMBODIMENTS

Figure 1A:
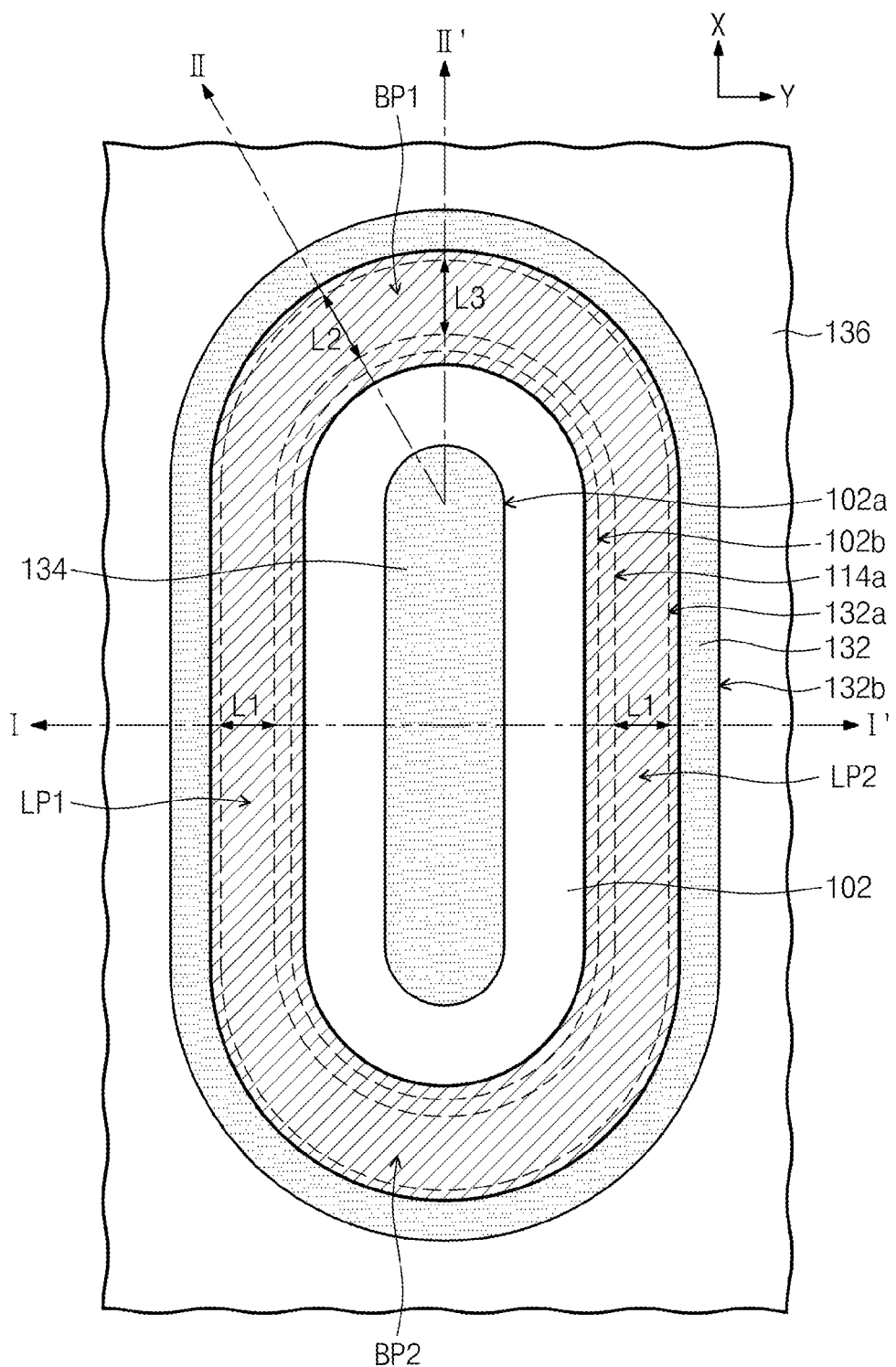
FIG. 1A is a plan view of a first embodiment of a semiconductor device in accordance with the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. However, in some instances, differences in sizes may be represented in the drawings, such in the cases of the different channel lengths and different widths of the gate pattern. Also, like numerals are used to designate like elements throughout the drawings.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "conductivity type" generally refers to p and n types. Therefore, a first or one conductivity type will refer to an n conductivity whereas a second or other conductivity type will refer to a p conductivity, or vice versa.

Also, spatially relative terms refer to the orientation shown in the drawings for ease of description and are not necessarily limiting as embodiments according to the inventive concept can assume orientations different than those illustrated in the drawings when in use. Such spatially relative terms will be clear in context. For example, "outer" or "inner" will generally refer to relative lateral dispositions.

A first embodiment of a semiconductor device in accordance with the inventive concept will now be described with reference to FIGS. 1A through 1C.

The semiconductor device includes a substrate 100 such as a silicon substrate, a germanium substrate or a compound semiconductor substrate. The substrate 100 may also comprise an epitaxially grown semiconductor material. A body region 112 (well) is defined in the substrate 100. The body region 112 delimits a drift region 114. More specifically, in this embodiment, the drift region 114 is part of the substrate 100 surrounded by the body region 112. Thus, the drift region 114 has a sidewall 114a contacting/contacted by the body region 112. Furthermore, the body region 112 is a counter-doped region of the substrate 100. That is, the body region 112 is an impurity region of a first conductivity type whereas the drift region 114 is of a second conductivity type.

A first source/drain region 132 is disposed in the body region 112. The first source/drain region 132 is a region of the substrate 100 counter-doped with respect to the body region 112. That is, the first source/drain region 132 is an impurity region of the second conductivity type.

When viewed in plan (FIG. 1A), the first source/drain region 132 has the shape of a loop. Therefore, the first source/drain region 132 has an inner sidewall 132a and an outer sidewall 132b. Furthermore, the first source/drain region 132 surrounds the drift region 114, and the body region 112 is interposed between the inner sidewall 132a of the first source/drain region 132 and the drift region 114. Thus, the first source/drain region 132 is spaced laterally from the drift region 114.

A pick-up region 136 is disposed in the body region 112 to the outside of the first source/drain region 132. The pick-up region 136 surrounds the first source/drain region 132 and, in this respect, may contact the outer sidewall 132b of the first source/drain region 132. In an example of this embodiment, the pick-up region 136 is an impurity region of the first conductivity type whose dopant concentration is higher (+ conductivity) than that of the body region 112.

A second source/drain region 134 is disposed in the drift region 114. In this embodiment, the second source/drain region 134 is an impurity region of the second conductivity type and whose dopant concentration is higher than that of the drift region 114. Referring to FIG. 1A, the second source/drain region 134 is elongated in a first direction which is the direction of the X axis in the figure. A main (central) portion of the second source/drain region 134 extending longitudinally in the first direction has a uniform width (the width being the dimension of the region 134 as measured in a second direction perpendicular to the first direction, i.e., in the direction of the Y axis in the figure). End portions of the second source/drain region 134 are rounded and convex.

A device isolation pattern 102 of insulating material is disposed in the drift region 114. When viewed in plan (FIG. 1A), the device isolation pattern 102 has the shape of a loop. Therefore, the device isolation pattern 102 has an inner sidewall 102a and an outer sidewall 102b. Furthermore, the device isolation pattern 102 surrounds the second source/drain region 134. In this respect, the inner sidewall 102a of the device isolation pattern 102 may contact the second source/drain region 134.

The device isolation pattern 102 is also laterally spaced from the body region 112. That is, part of the drift region 114 is interposed between the device isolation pattern 102 and the body region 112. Therefore, the outer sidewall 102b of the device isolation pattern 102 contacts the drift region 114, i.e., a region of the second conductivity type, but does not contact the body region 112.

Referring to FIG. 1A, the device isolation pattern 102 has straight segments disposed at both sides of the main portion of the second source/drain region 134, and curved segments disposed at both ends of the second source/drain region 134. The straight segments extend longitudinally in the first direction. When viewed in plan (FIG. 1A), the curved segments are convex and rounded.

The semiconductor device also has a gate pattern 122, 124. The gate pattern 122, 124 may include a gate insulating layer 122 on the body region 112 and a gate electrode 124 on the gate insulating layer 122. The gate insulating layer 122 may include at least one material selected from the group consisting of oxide (e.g., a thermal oxide), nitrides, oxynitrides and/or high-k dielectrics (e.g., metal oxides such as aluminum oxide or hafnium oxide). The gate electrode 124 may include at least one material selected from the group consisting of doped semiconductor materials (e.g., doped silicon or doped germanium), metals (e.g., tungsten, titanium, or tantalum), conductive metal nitrides (e.g., titanium nitride or tantalum nitride), and metal-semiconductor compounds (e.g., tungsten silicide or cobalt silicide).

In this embodiment, the gate pattern 122, 124 comprises a pair of linear portions LP1 and LP2 (lines) extending longitudinally in the first direction and a pair of bend portions BP1 and BP2 (bends). Each of the linear portions LP1 and LP2 may have a uniform width (dimension as measured in the second direction), and the respective widths of the linear portions LP1 and LP2 may be the same. The second source/drain region 134 is disposed between the linear portions LP1 and LP2 and extends parallel to the linear portions LP1 and LP2 in this example.

Outer sides of the linear portions LP1 and LP2 extend on and cover inner portions of straight segments of the body region 112, respectively. Likewise, outer sides of the bend portions BP1 and BP2 extend on and cover inner portions of curved segments of the body region 112, respectively. On the other hand, the gate pattern 122, 124 extends on and covers an outer part of the device isolation pattern 102 and thus extends around an inner part of the device isolating pattern 102 as viewed in plan.

The first bend portion BP1 connects corresponding (adjacent) first ends of the linear portions LP1 and LP2 and the second bend portion BP2 connects the other ends of the corresponding (adjacent) linear portions LP1 and LP2. The widths of the bend portions BP1 and BP2 are greater (at each point therealong) than the widths of the line portions LP1 and LP2. The widths of the bend portions BP1 and BP2 are the dimensions of the bend portions BP1 and BP2 normal to the tangent of the outer sidewall of the bend portions BP1 and BP2, in plan. In this embodiment, the width of each bend portion BP1 and BP2 increases from the ends of the linear portions LP1 and LP2 and becomes maximum at a point where the tangent to the outer side of the bend portion extends in the second direction (direction of the Y axis).

In the illustrated example of this embodiment, the first source/drain region 132 is disposed in the body region 112, the inner sidewall of the gate pattern 122, 124 extends upright on the device isolation pattern 102, and the outer sidewall of the gate pattern 122, 124 extends upright on the first source/drain region 132. In another example (not shown), the outer sidewall of the gate pattern 122, 124 is substantially coplanar with the inner sidewall of the first source/drain region 132.

Also, in the illustrated example, the gate pattern 122, 124 covers the part of the body region 112 located between the first source/drain region 132 and the drift region 114, the part of the drift region 114 located between the body region 112 and the device isolation pattern 102 and an outer portion of the device isolation pattern 102. A channel region is defined in the body region 112 beneath the gate pattern 122, 124. When the semiconductor device is operating, a channel formed in the channel region allows charge carriers (electrons or holes) to move between the first and second source/drain regions 132 and 134 via the drift region 114. The carriers take the shortest distance to move through the channel. The channel length refers to the length of the path (i.e., the aforementioned distance) along which the carriers move through the channel. Therefore, the channel length at any particular point along the gate pattern 122, 124, in this example, is equal to the shortest distance between the inner sidewall 132a of the first source/drain region 132 and the sidewall 114a of the drift region 114.

The channel region under each line portion LP1 and LP2 has a channel length L1, and the channel length L1 corresponds to the dimension of the channel in the second direction (Y axis in FIG. 1A).

The channel region beneath each bend portion BP1 and BP2 has a channel length L2, and a channel length L3 corresponding to the dimension of the channel in the first direction (Y axis in FIG. 1A), wherein the channel length L2 corresponds to the dimension of the channel in a direction different than the first and second directions. The second and third channel lengths L2 and L3 may be the same as in the illustrated example of this embodiment. However, in another example (not shown), the second and third channel lengths L2 and L3 are different. In either case, the second and third channel lengths L2 and L3 are each greater than the first channel length L1.

Accordingly, when the semiconductor device is operating, charge carriers moving between the first source/drain region 132 and the second source/drain region 134 in the channel beneath the bend portions BP1 and BP2 travel a longer distance than carriers moving between the first source/drain region 132 and the second source/drain region 134 in the channel beneath the line portions LP1 and LP2.

In the case in which the first source/drain region 132 functions as a source and the second source/drain region 134 functions as a drain, first charge carriers generated from the first source/drain region 132 move to the main portion of the second source/drain region 134 adjacent the linear portions L1 and L2, and second charge carriers generated from the first source/drain region 132 move to both end portions of the second source/drain region 134 adjacent the bend portions BP1 and BP2.

According to the inventive concept, the channel lengths L2 and L3 of the channel region under the bend portions BP1 and BP2 are each longer than the channel length L1 of the channel region under the line portions LP1 and LP2. Therefore, the second charge carriers do not concentrate as much at the ends of the second source/drain region 134 adjacent the bend portions BP1 and BP2 compared to a case in which the channel length was uniform (L1=L2=L3). As a result, also in the case in which a high voltage is applied to the second source/drain region 134, current is also less likely to become concentrated at the end portions of the second source/drain region 134. Thus, leakage current through the body region 112 adjacent to the end portions of the second source/drain region 134 may be minimized. Therefore, a high current transistor having high reliability may be provided.

A method of manufacturing the first embodiment of a semiconductor device in accordance with the inventive concept will be described with reference to FIGS. 2A to 5C. Since the physical features of the first embodiment which have been described above in detail, many of the physical features and aspects of the first embodiment will not be described in detail in the description of the method that follows.

Figure 2A:
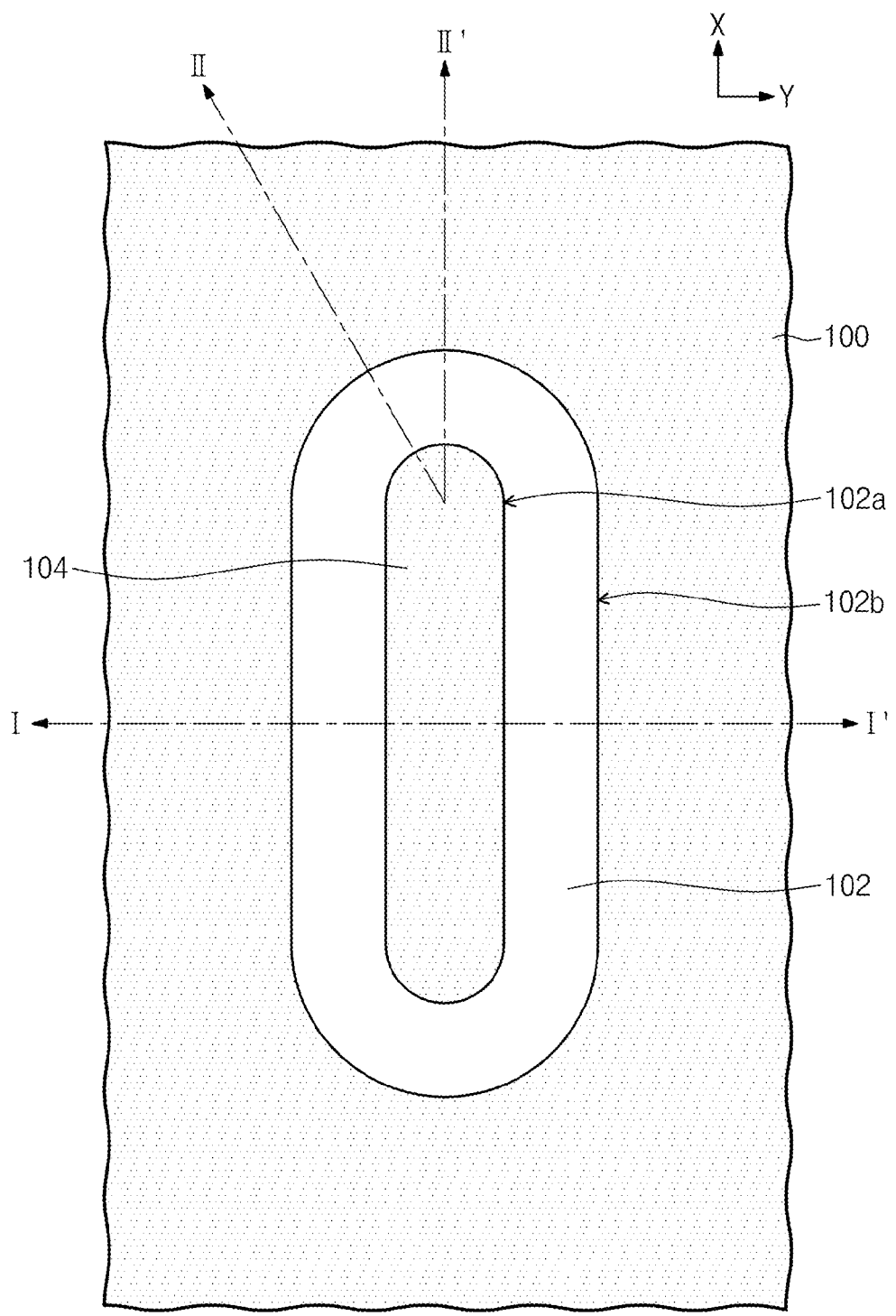
Figure 2B:
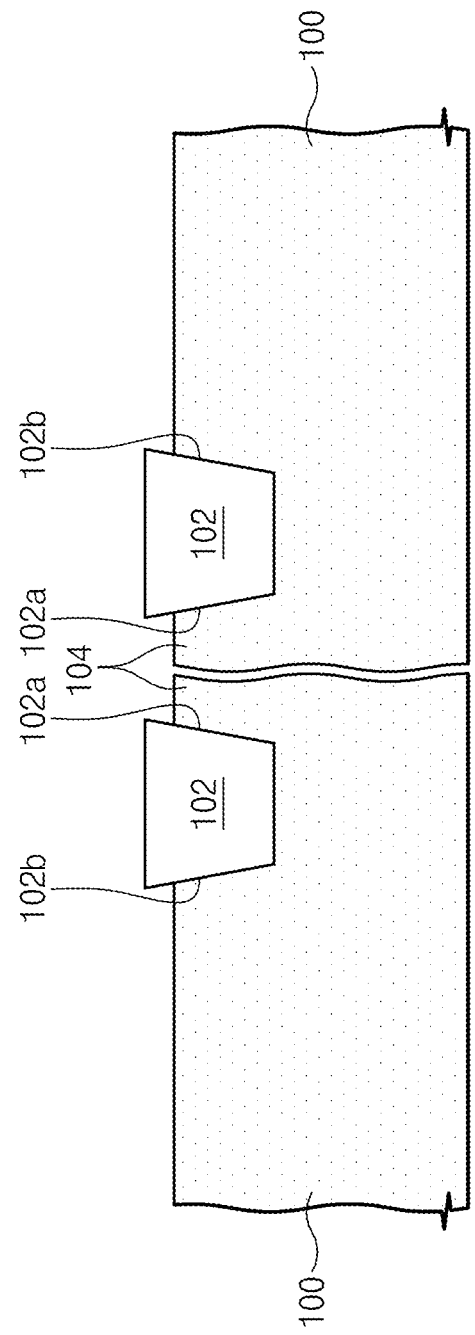
Figure 2C:
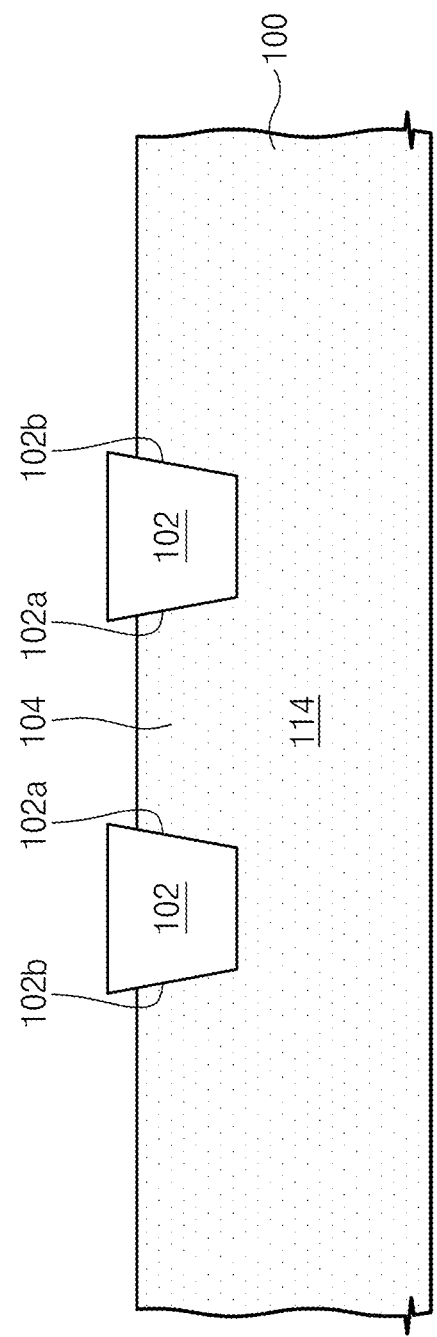

Referring first to FIGS. 2A through 2C, loop-shaped device isolation pattern 102 is formed in substrate 100. The substrate 100 may be epitaxially grown from a base of semiconductor material doped with an impurity of a first conductivity type and may be doped with an impurity of a second conductivity type. The device isolation pattern 102 is formed by forming an elliptical trench in the substrate, and then filling the trench with insulating material. The device isolation pattern 102 thus surrounds and delimits an isolation portion 104 of the substrate 100. The isolation portion 104 is elongated in a first direction. That is, the dimension of the isolation portion 104 in the first direction is greater than the dimension of the isolation portion 104 in a second direction perpendicular to the first direction. Also, the ends of the isolation portion 104 are formed to be convex and rounded.

Figure 3A:
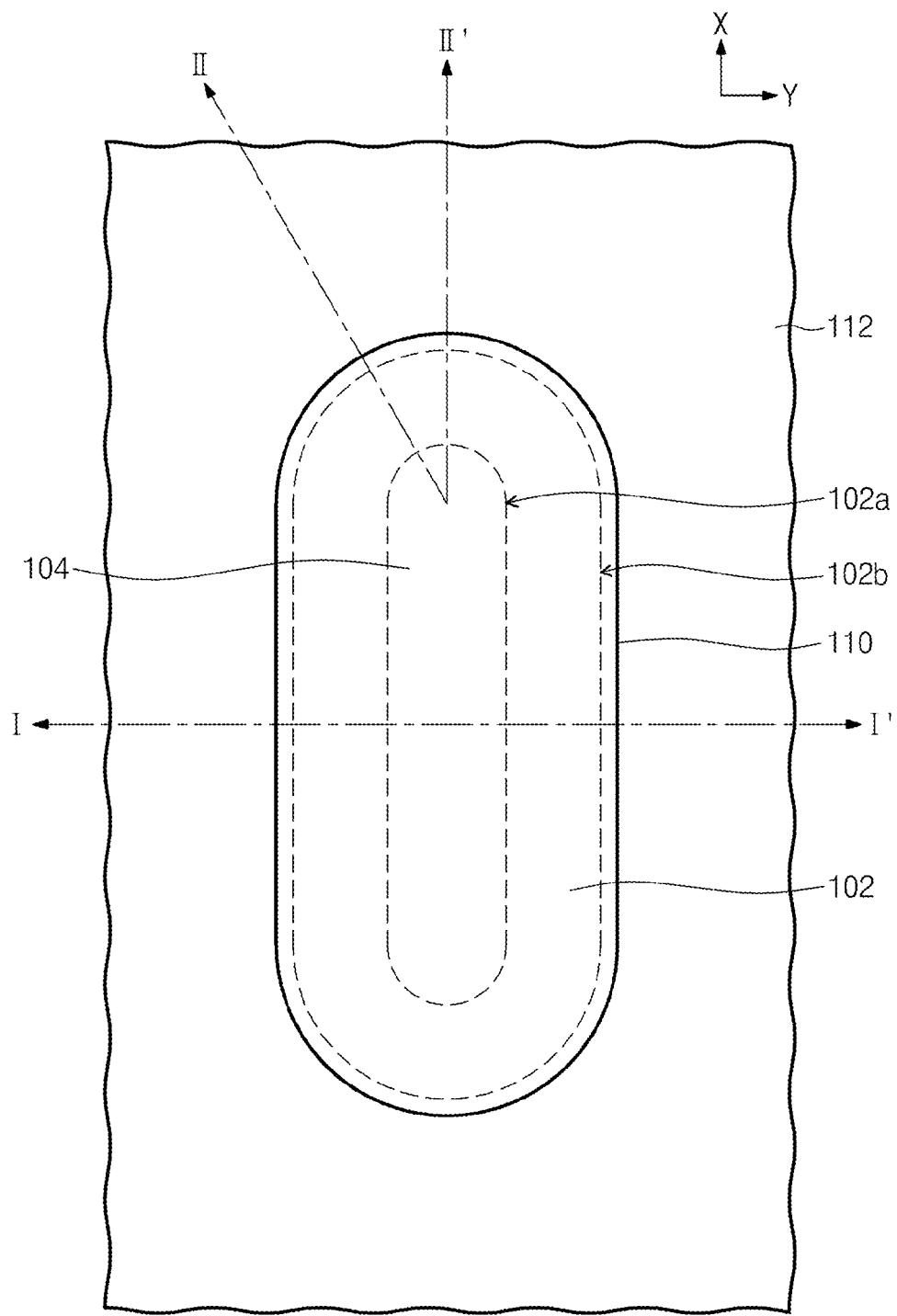
Figure 3B:
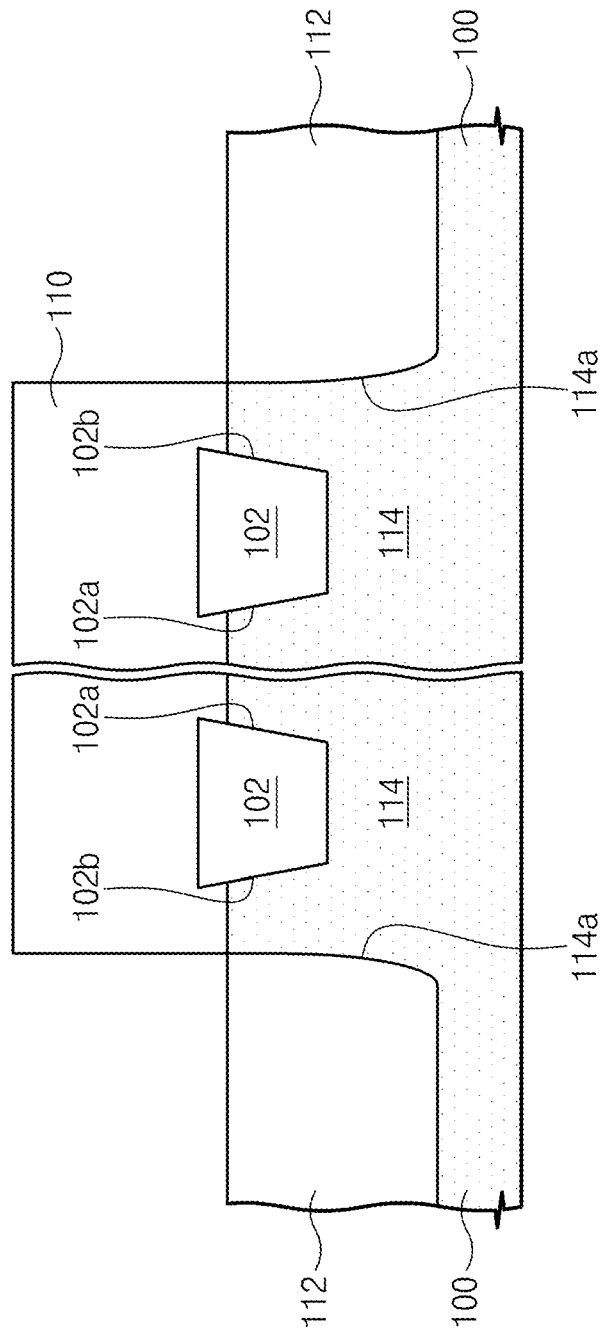
Figure 3C:
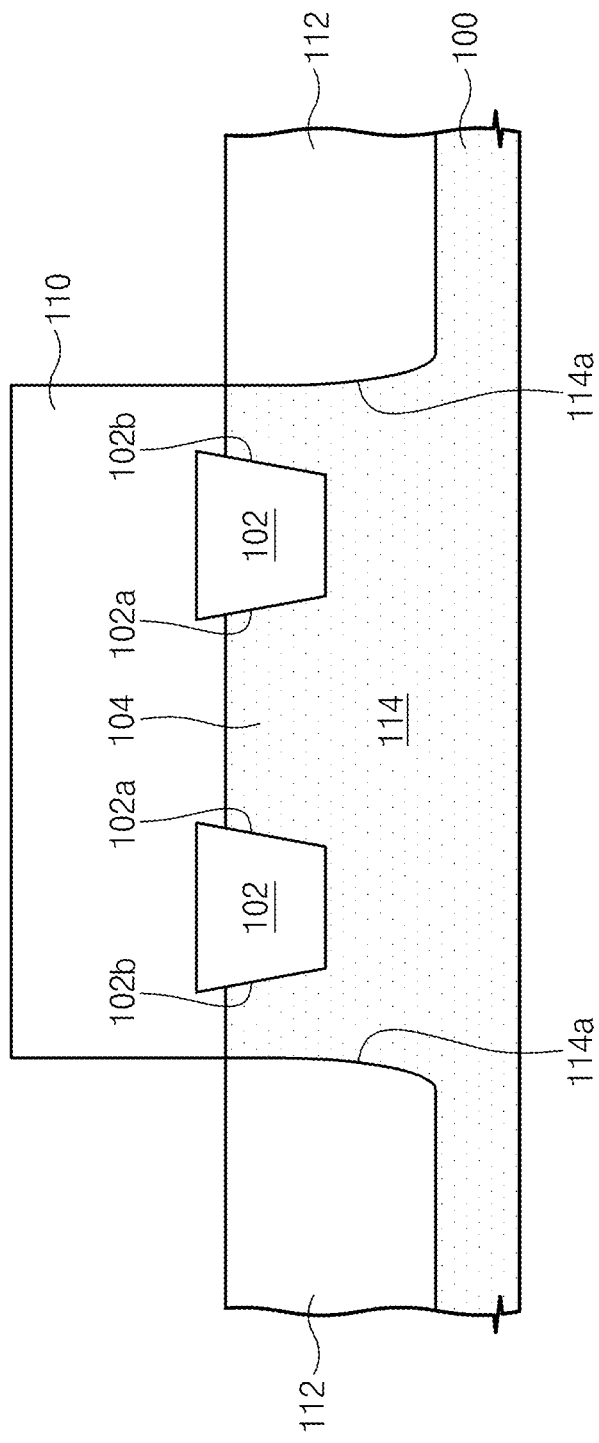

Referring to FIGS. 3A through 3C, a mask 110 is formed on the substrate 100 to cover the isolation portion 104 and a portion of the substrate 100 adjacent to the outer side of the device isolation pattern 102. The mask 110 may also cover the device isolation pattern 102. The mask 110 may be formed of photosensitivity material.

Dopant (impurity ions) of the first conductivity type is implanted using the mask 110 as an ion implantation mask to form body region 112. The body region 112 is thus laterally surrounds the device isolation pattern 102 but is laterally spaced from the device isolation pattern 102. As a result, drift region 114 is surrounded and defined by the body region 112. The drift region 114, as is clear from the description above, is a portion of the substrate of the second conductivity type.

Figure 4A:
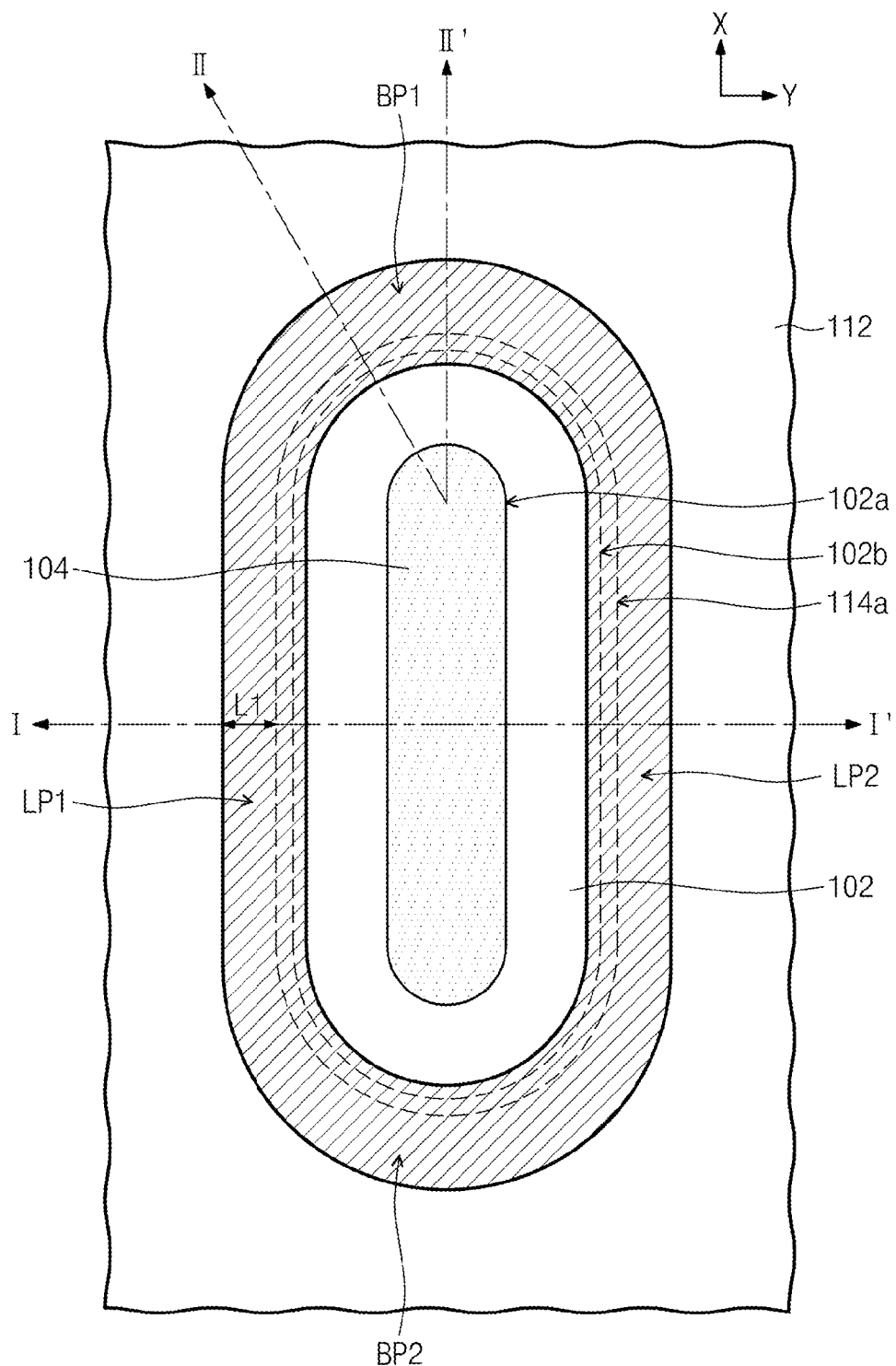
Figure 4B:
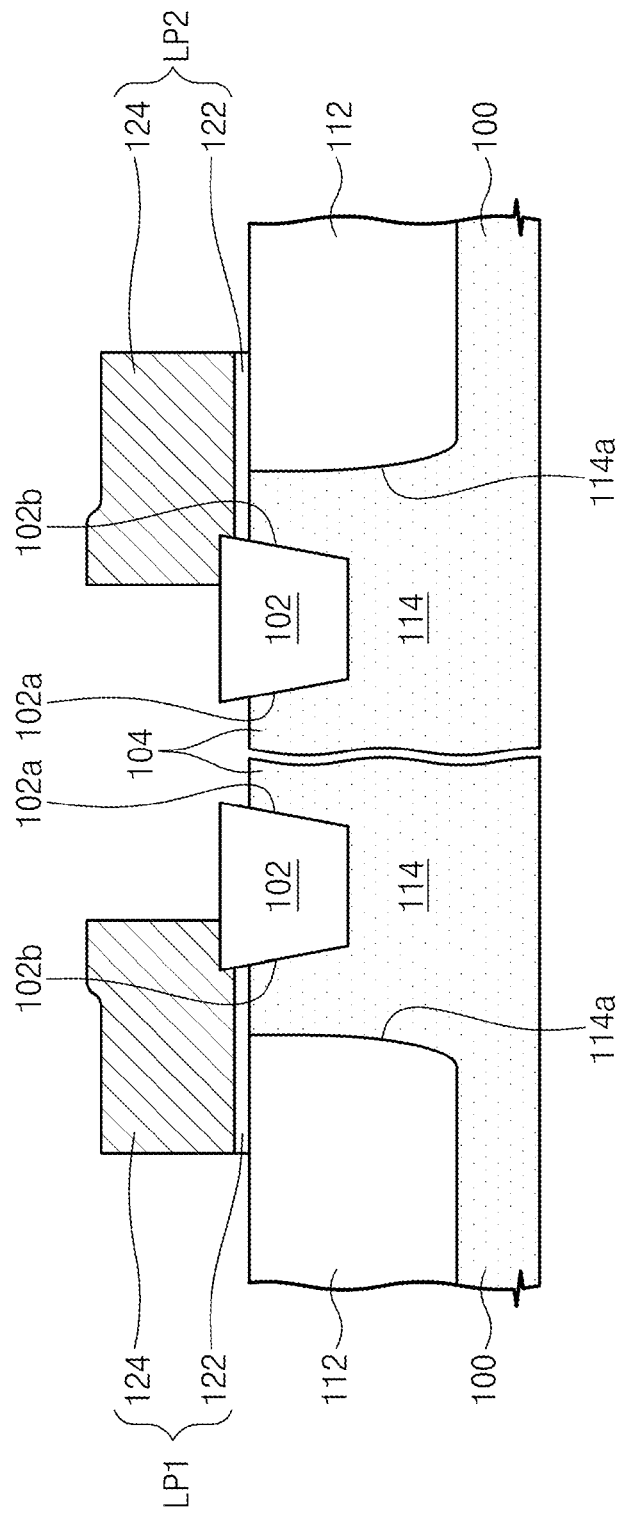
Figure 4C:
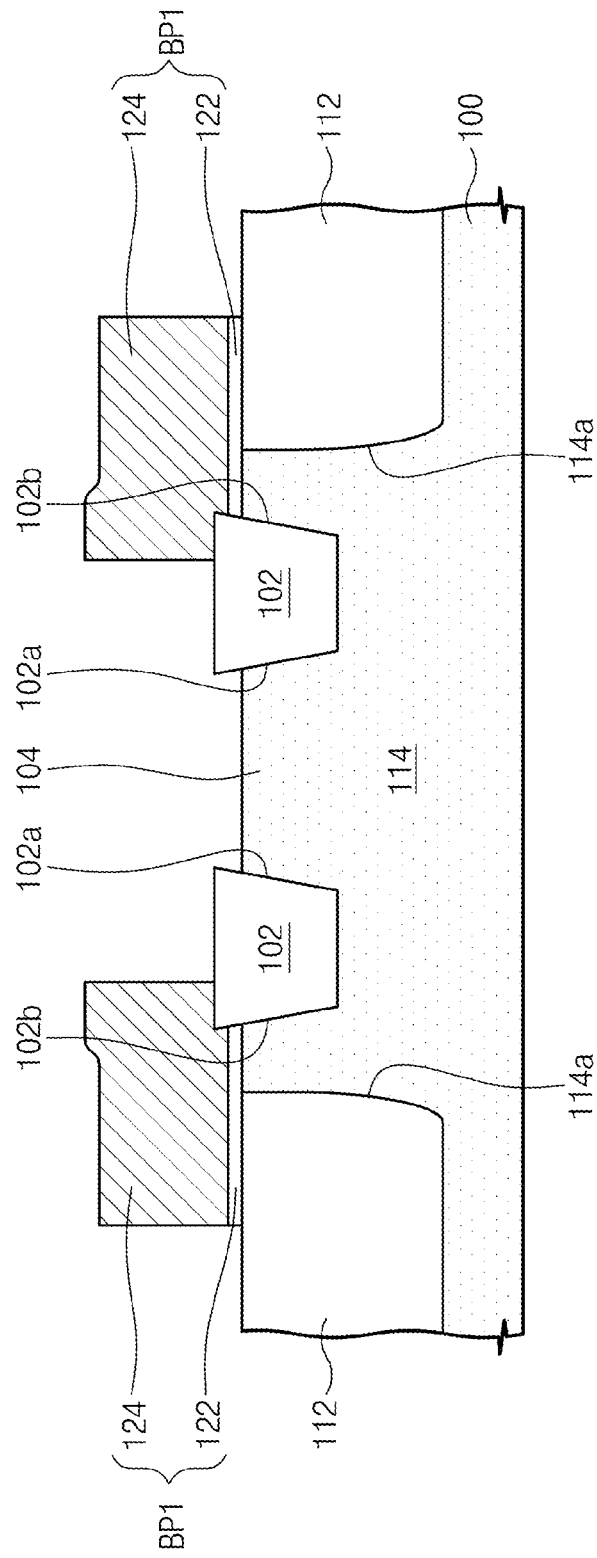

Referring to FIGS. 4A through 4C, the mask 110 is removed. Then gate pattern 122,124 having the form of a loop is formed on the substrate 100. For example, an insulating layer and a gate electrode layer are formed on the substrate 100, and then the insulating layer and the gate electrode layer are patterned to form a loop-shaped gate pattern 122, 124 that covers an inner side portion of the body region 112, the portion of the drift region 114 located between the body region 112 and the device isolation pattern 102, and an outer side potion of the device isolation pattern 102. In this patterning process, the gate pattern 122, 124 is formed such that the width of each bend portion BP1 and BP2 thereof increases from the ends of the linear portions LP1 and LP2 and becomes maximum at a point where the tangent to the outer side of the bend portion extends in the second direction (direction of the Y axis in FIG. 4A).

Figure 5A:
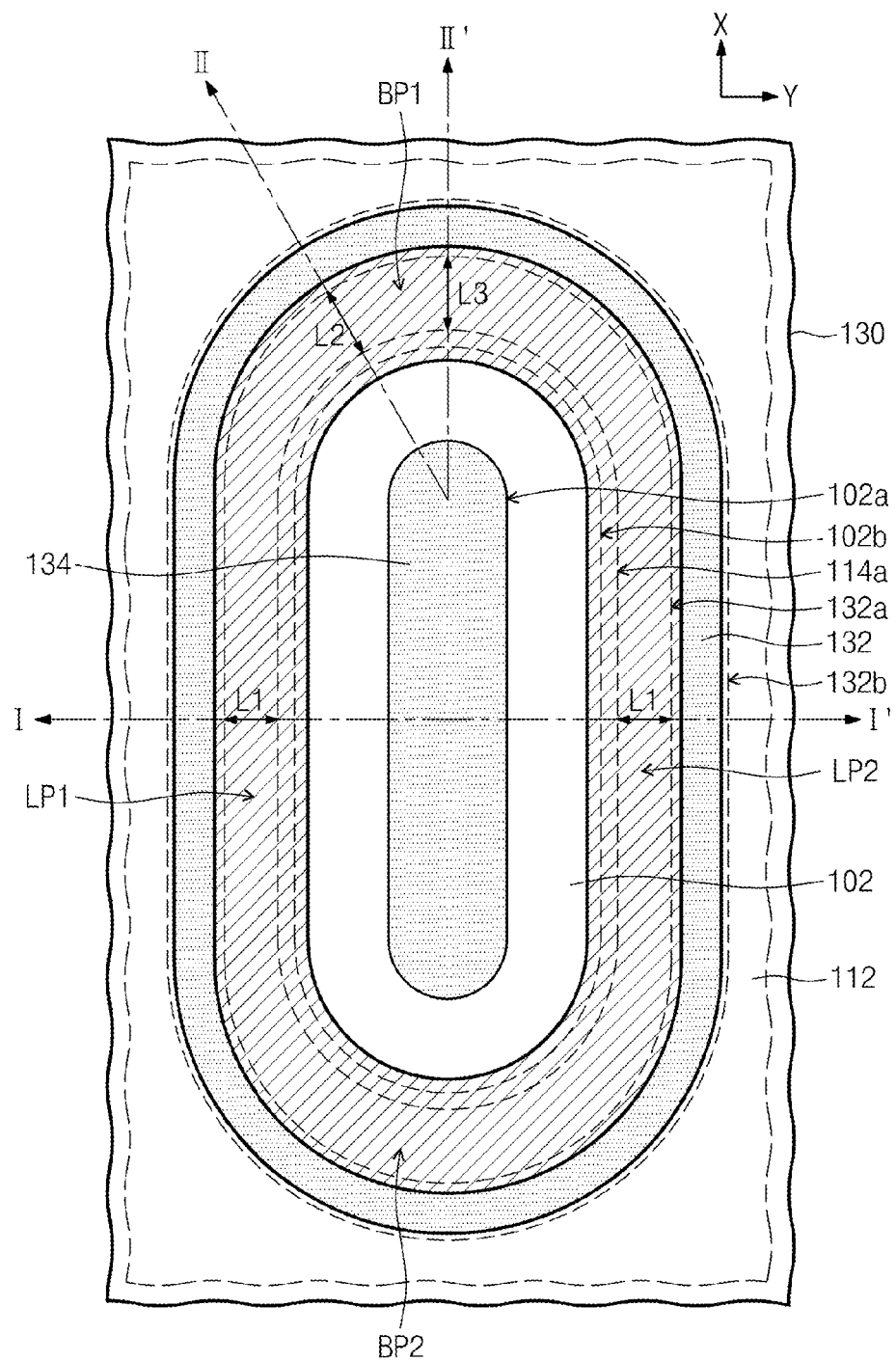
Figure 5B:
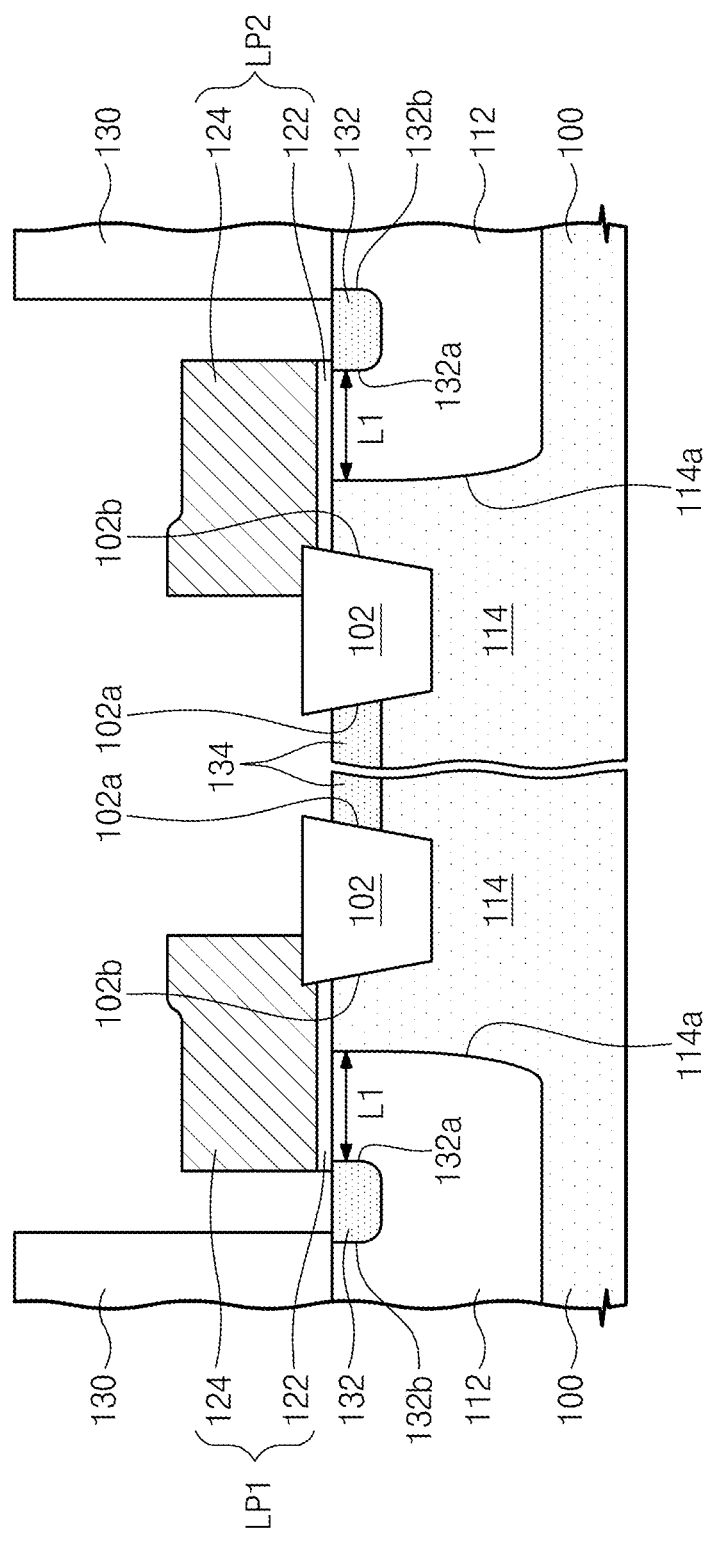
Figure 5C:
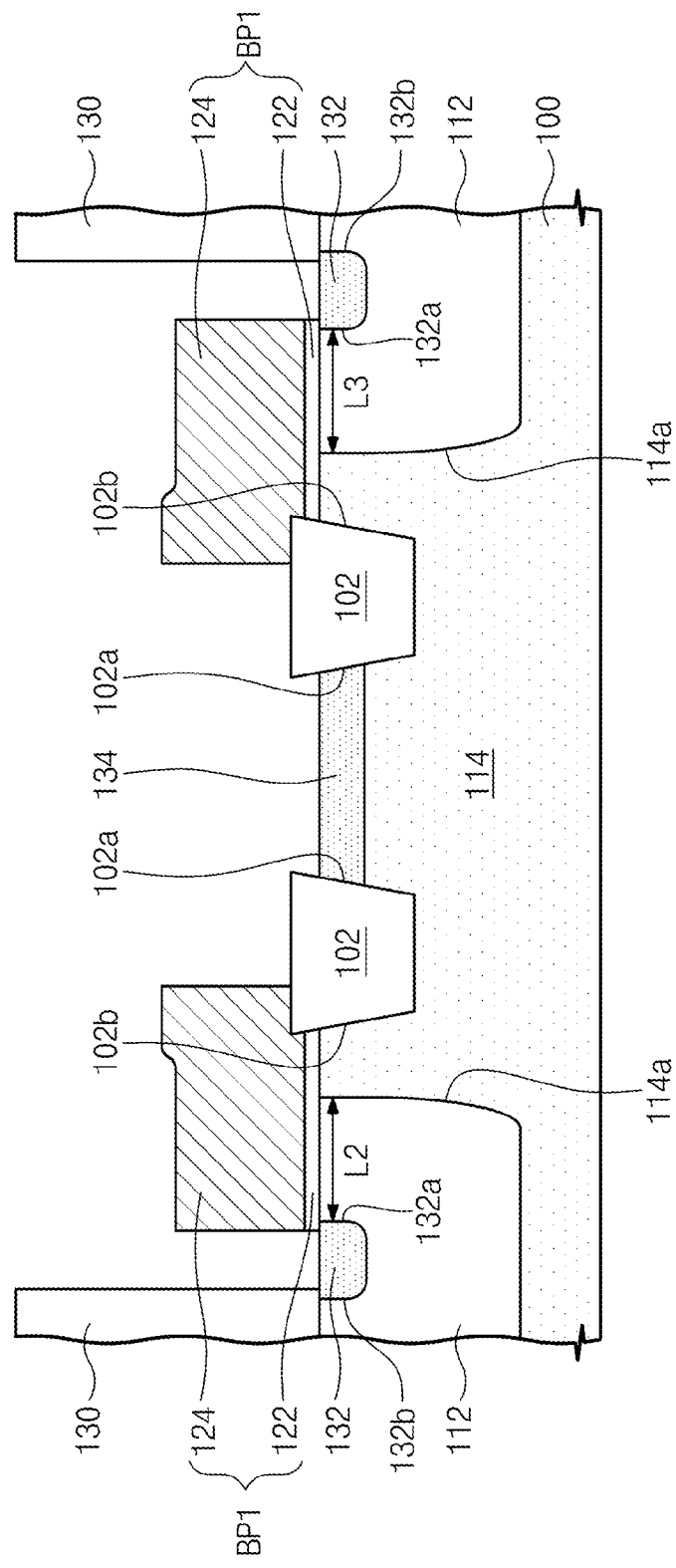

Referring to FIGS. 5A through 5C, a mask 130 is then formed on the substrate 100. The mask 130 is laterally spaced from the gate pattern 122, 124 to expose part of the body region 112 and covers a remaining portion of the body region 112. The part of the body region 112 exposed by the mask pattern 130 extends along the outer side of the gate pattern 122, 124. The mask pattern 130 also exposes the isolation portion 104, in this example.

Dopant (impurity ions) of the second conductivity type is implanted using the mask 130, the gate pattern 122, 124 and the device isolation pattern 102 as an ion implantation mask. Thus, the exposed part of the body region 112 is counter-doped to form loop-shaped first source/drain region 132. In this process, inner sidewall 132a of the first source/drain region 132 may be self-aligned with the outer sidewall of the gate pattern 122, 124. Alternatively, after the dopant is implanted, an activation process is performed such that the dopant is diffused and the inner sidewall 132a of the first source/drain region 132 becomes located beneath the gate pattern 122, 124 and hence, becomes closer to the device isolation pattern 102 than the outer sidewall of the gate pattern 122 and 124. The activation process may be a thermal process.

Furthermore, in this ion implantation process, the isolation portion 104 is doped to form second source/drain region 134. As a result of the ion implantation process, the dopant concentration of the second source/drain region 134 is greater than that of the drift region 114.

The mask 130 is then removed, and another mask is formed on the substrate 100 to cover the first and second source/drain regions 132 and 134, and expose that part of the body region 112 laterally outwardly of the first source/drain region 132. Dopant (impurity ions) of the first conductivity type is implanted using this mask as an ion implantation mask to form a pick-up region 136. As a result of this ion implantation process, the pick-up region 136 has a dopant concentration greater than that of the body region 112.

A second embodiment of a semiconductor device in accordance with the inventive concept will now be described with reference to FIGS. 6A through 6C. As will be apparent from the drawings and description that follows, except as otherwise noted, the features/aspects of the second embodiment are similar to those of the first embodiment.

Figure 6A:
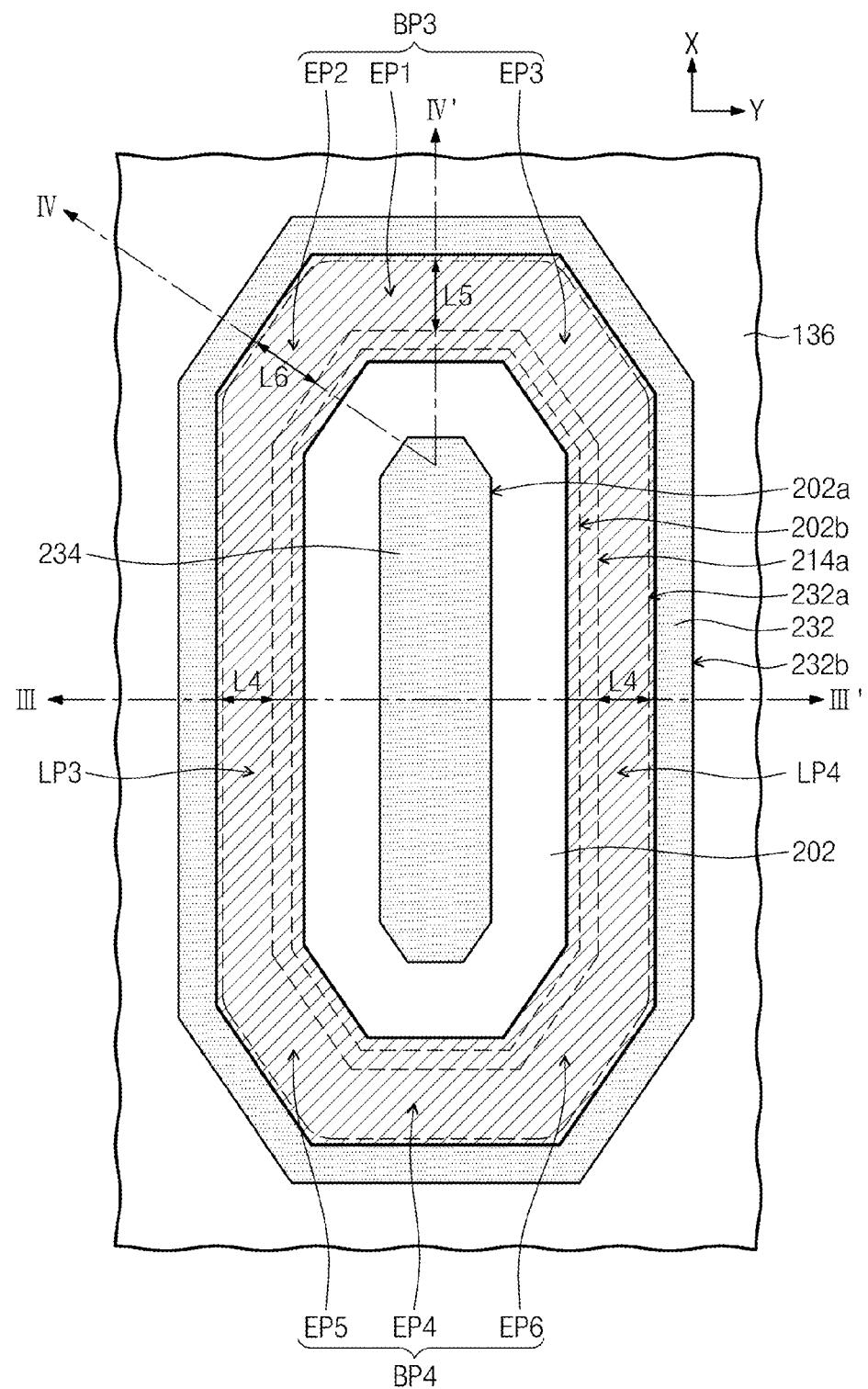
FIG. 6A is a plan view of a second embodiment of a semiconductor device in accordance with the inventive concept.
Figure 6B:
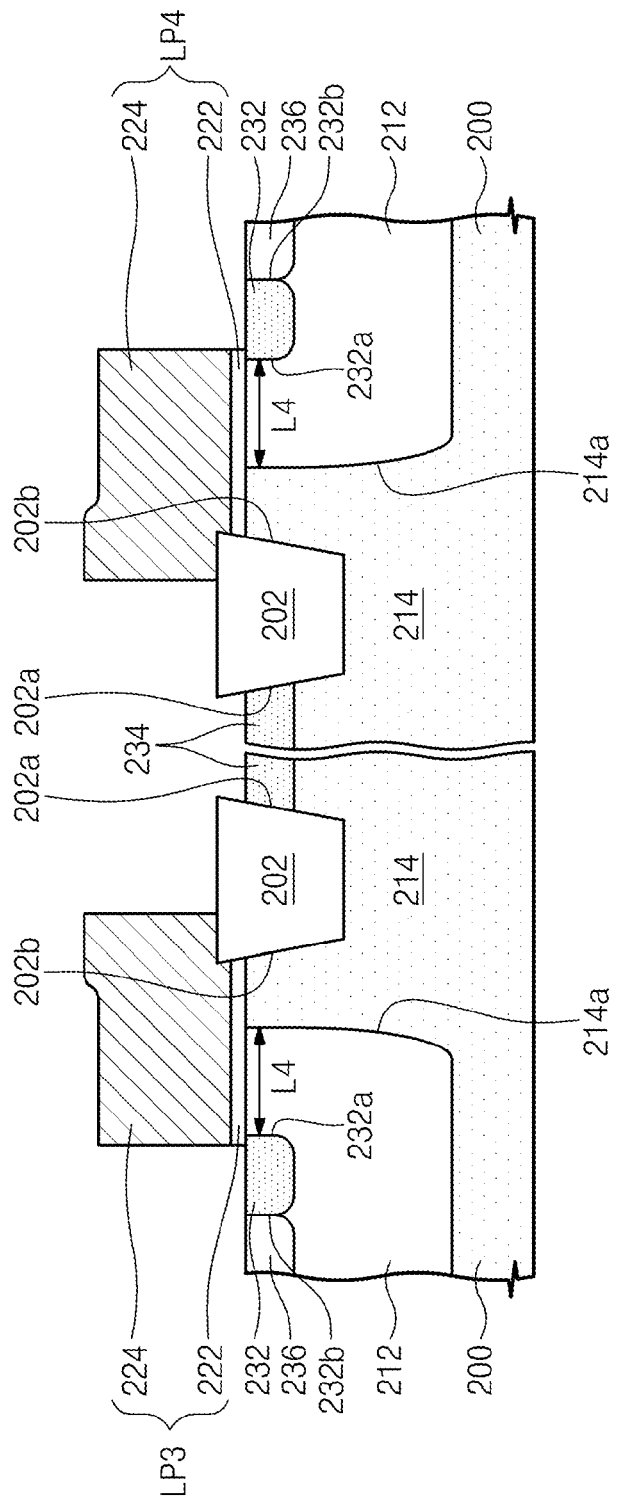
FIG. 6B is a sectional view of the second embodiment of the semiconductor device taken along line I-I' of FIG. 6A.
Figure 6C:
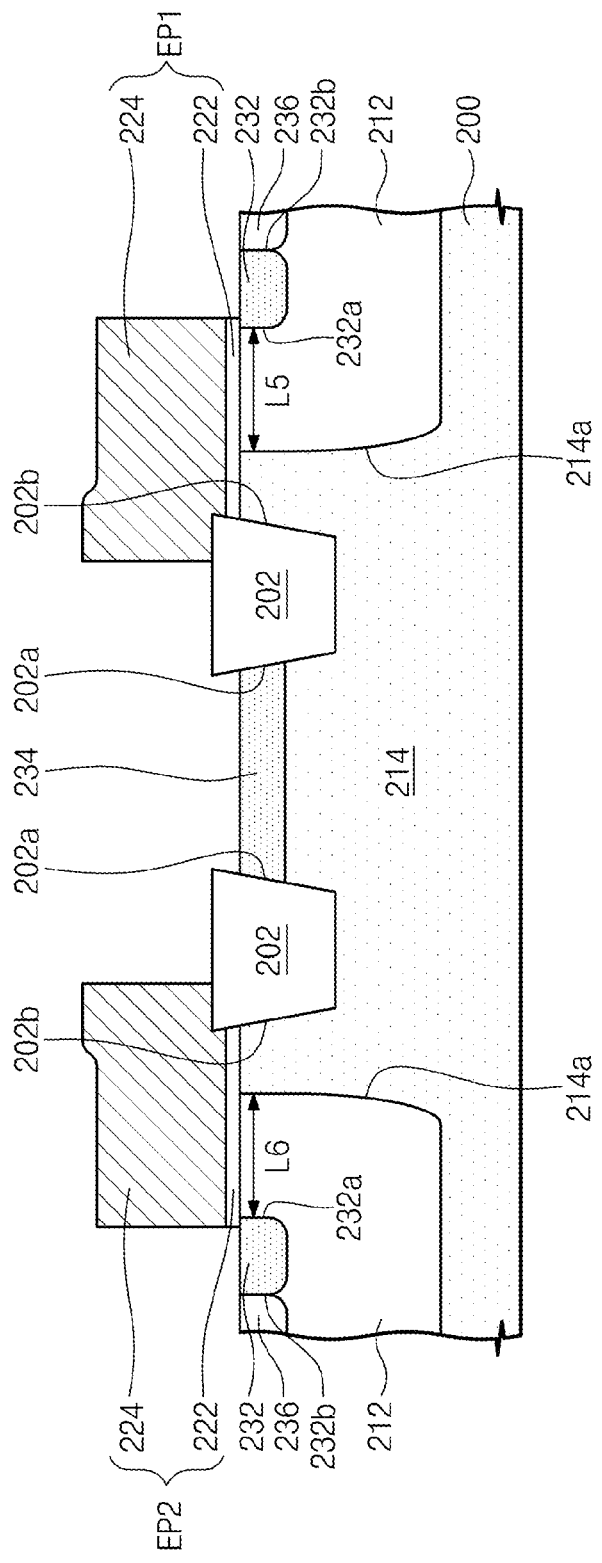
FIG. 6C is a sectional view of the second embodiment of the semiconductor device taken along line II-II' of FIG. 6A.

Referring to FIGS. 6A through 6C, the semiconductor device has a substrate 200 similar to the substrate 100 described with reference to FIGS. 1A through 1C, and a body region 212 counter-doped with respect to the substrate 200. The body region 212 delimits a drift region 214 of the substrate. Therefore, the body region 212 is of a first conductivity type and the drift region is of a second conductivity type. Furthermore, an outer side wall 214a of the drift region 214 is surrounded and contacted by the body region 212.

A first source/drain region 232 is disposed in the body region 212. The first source/drain region 232 is counter-doped with respect to the body region 212 so as to be of a second conductivity type. When viewed in plan, the first source/drain region 232 has the form of a loop laterally spaced apart from but surrounding the drift region 214. Therefore, the first source/drain region 232 thus has an inner sidewall 232a facing towards the drift region 214, and an outer sidewall 232b. Furthermore, part of the body region 212 is interposed between the inner sidewall 232a of the first source/drain region 232 and the drift region 214.

A pick-up region 236 is disposed in the body region 212 outside the first source/drain region 232. The pick-up region 236 is an impurity region of the first conductivity type but of a dopant concentration greater than that of the body region 212. The pick-up region 236 surrounds the first source/drain region 232 as disposed in contact with the outer sidewall 232b of the first source/drain region 232.

A second source/drain region 234 is disposed in the drift region 214. The second source/drain region 234 is an impurity region of the second conductivity type dopant but having a dopant concentration greater than that of the drift region 214. The second source/drain region 234 is elongated in a first direction, thus having attributes similar to those of the second source/drain region 134 of the first embodiment described above.

A device isolation pattern 202 of insulating material is disposed in the drift region 214. The device isolation pattern 202 surrounds and delimits the second source/drain region 234. Thus, as viewed in plan, the device isolation pattern 202 has the shape of a loop surrounding the second source/drain region 234, and includes an inner sidewall 202a and an outer sidewall 202b. The device isolation pattern 202 is also laterally spaced from the body region 212. That is, the outer sidewall 202b of the device isolation pattern 202 does not contact the body region 212.

In this embodiment, the device isolation pattern 202 has straight sections extending along the sides of the main portion of the second source/drain region 234, respectively, and bending sections extending along the ends of the second source/drain regions 234. Each of the straight sections is a straight segment extending linearly (longitudinally) in the first direction. Each of the bending sections includes a plurality of straight segments each extending linearly (longitudinally) in a direction different from the first direction. When viewed in plan, the straight segments that constitute each bending section collectively have a convex shape.

A gate pattern 222, 224 may include a gate insulating layer 222 and a gate electrode 224 on the gate insulating layer 222. The gate insulating layer 222 and the gate electrode 224 may be of any of the materials of the gate insulating layer 222 and the gate electrode 224 described with reference to FIGS. 1A through 1C, respectively.

The gate pattern 222, 224 includes first and second linear portions LP3 and LP4 each extending longitudinally in the first direction, and a pair of bending portions BP3 and BP4. Each of the line portions LP3 and LP4 may have a uniform width (dimension as measured in the second direction). Furthermore, these widths of the line portions LP3 and LP4 may be the same.

In the illustrated example of this embodiment, the first bending portion BP3 includes a linear first extension EP1 extending longitudinally in the second direction, a linear second extension EP2 extending longitudinally in a third direction different from the first and second directions, and a linear third extension EP3 extending longitudinally in a fourth direction different from the first, second and third directions. The second extension EP2 extends between and connects (and in this case is contiguous with) one end of the first linear portion LP3 and a corresponding (adjacent) end of the first extension EP1. The third extension portion EP3 extends between and connects (and in this case is contiguous with) one end of the second line portion LP4 and the other corresponding (adjacent) end of the first extension portion EP1. The second bending portion BP4 includes a linear fourth extension EP4 extending longitudinally in the second direction, a linear fifth extension EP5 extending longitudinally in the fourth direction and a linear sixth extension EP6 extending longitudinally in the third direction. The fifth extension EP5 extends between and connects (and in this case is contiguous with) the other end of the first linear portion LP3 and the corresponding (adjacent) end of the fourth extension portion EP4. The sixth extension EP6 extends between and connects the other end of the second linear portion LP4 and the other end of the fourth extension portion EP4. As viewed in plan, the extensions (EP1, EP2 and EP3, or EP4, EP5 and EP6, for example) of each bending portion BP3 or BP4 collectively have a convex shape.

The bending portions BP3 and BP4 may be wider than the linear portions LP3 and LP4 in the second direction. For example, each of the first and fourth extensions EP1 and EP4 may be wider than each of the linear portions LP3 and LP4. Also, the second and sixth extensions EP2 and EP6 may be wider than each of the line portions LP3 and LP4. Likewise, the third and fifth extensions EP3 and EP5 may be wider than each of the linear portions LP3 and LP4.

The gate pattern 222, 224 may be disposed relative to the device isolation pattern 202 and the first source/drain region 232, similarly to the relative dispositions described above between the gate pattern 122, 124 and the isolation pattern 102 and first source/drain region 132. In any case, the gate pattern 222, 224 covers that portion of the body region 212 located between the first source/drain region 232 and the drift region 214, that portion of the drift region 214 located between the body region 212 and the device isolation pattern 202, and an outer side of the device isolation pattern 202. A channel region is defined in the body region 212 beneath the gate pattern 222, 224. When the semiconductor device is operating, a channel can be formed in the channel region. The channel length, at any particular point along the channel region, is the shortest distance along which charge carriers move across the channel.

The channel region, at any location beneath the linear portions LP3 and LP4, has a (first) channel length L4, which at such a location is the dimension of the channel in the second direction. The channel region, at a location under the bending portions BP3 and BP4, has a channel length greater than the first channel length L4. For example, the channel region, at a location beneath the first extension EP1, may have a (second) channel length L5 greater than the first channel length L4. The channel region, at a location beneath the second extension EP2, may have a (third) channel length L6 greater than the first channel length L4. Furthermore, as is also apparent from the description above, the second channel length L5 is the shortest distance between the inner sidewall 232a of the first source/drain region 232 disposed outside the first extension EP1 and the sidewall 214a of the drift region 214. The third channel lengths L6 is the shortest distance between the inner sidewall 232a of first source/drain region 232 disposed on the outside of the second extension portion EP2 and the sidewall 214a of the drift region 214. In the illustrated example of this embodiment, the second and third channel lengths L5 and L6 are the same. However, in another example of this embodiment, the second and third channel lengths L5 and L6 are different from each other.

A method of manufacturing the second embodiment of a semiconductor device, in accordance with of the inventive concept, will be described with reference to FIGS. 7A through 8C. The method, except where specifically noted, is essentially similar in all respects to that described above in connection with the manufacturing of the first embodiment of the semiconductor device. Therefore, various aspects of the method will not be described in further detail for the sake of brevity.

Figure 7A:
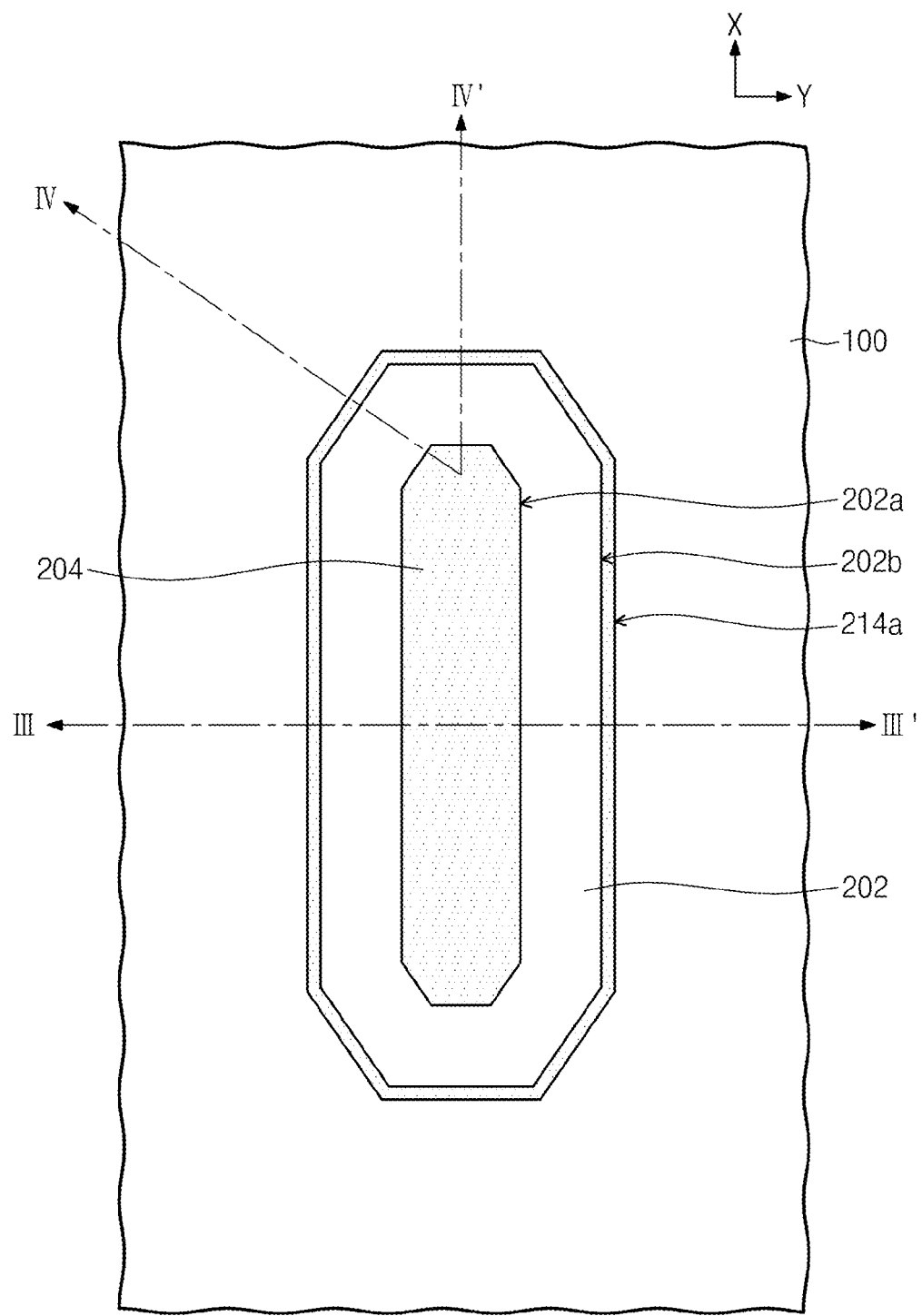
Figure 7B:
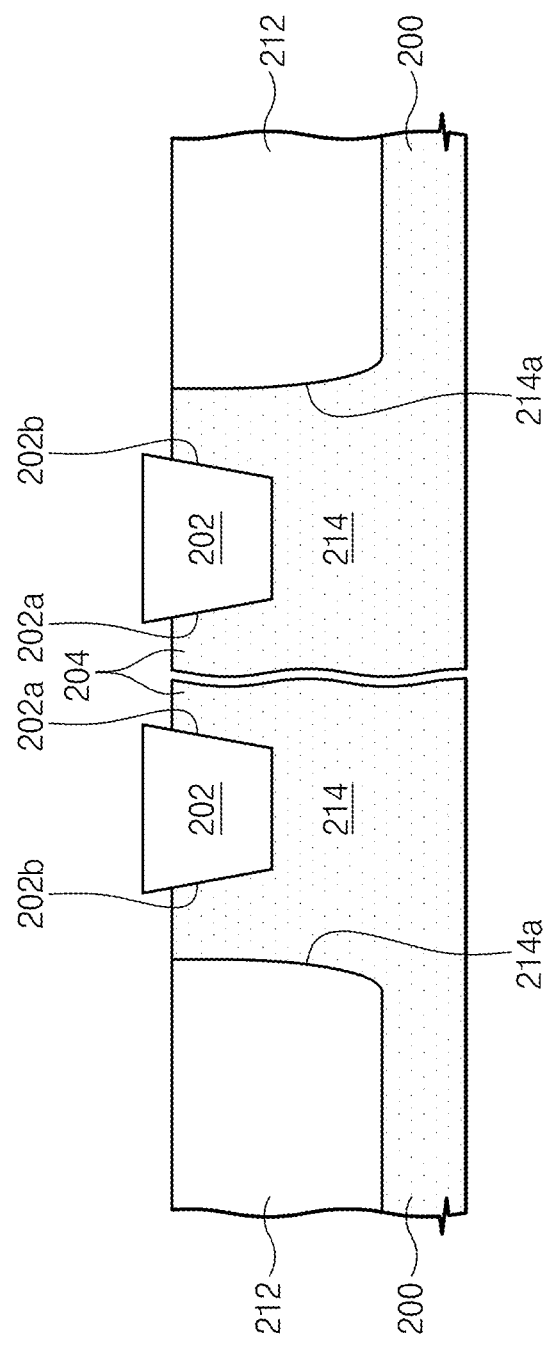
FIGS. 7B and 8B are sectional views taken along lines III-III' of FIGS. 7A and 8A, respectively.
Figure 7C:
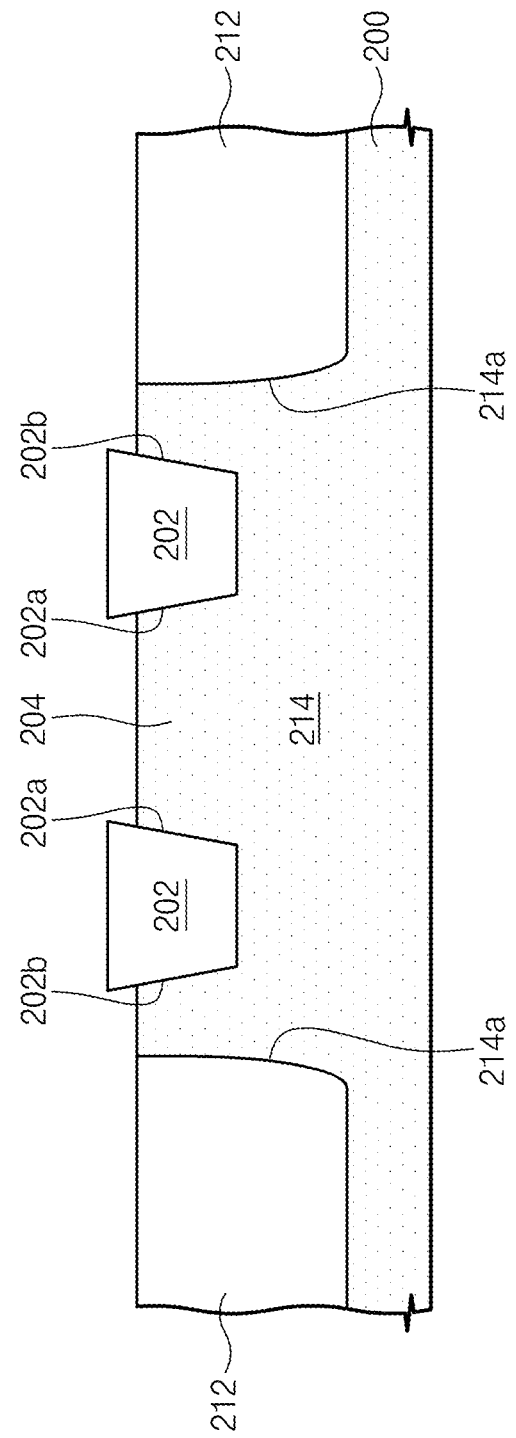

Referring to FIGS. 7A through 7C, device isolation pattern 202 is formed in substrate 200 to delimit isolation portion 204 of the substrate 200. For example, the substrate 200 may be epitaxially grown from a base of semiconductor material doped with an impurity so as to be of a first conductivity type, and may include semiconductor material doped with an impurity so as to be of a second conductivity type. The device isolation pattern 202 may be formed using the trench-forming and filling processes referred to above with reference to FIGS. 2A through 2C.

Furthermore, a body region 212 is formed in the substrate by forming a mask on the substrate 200 and then counter-doping the substrate 200 with dopant (ions) of the first conductivity type using the mask and/or the device isolation pattern 202 as an ion implantation mask. At this time, drift region 214 is delimited by the body region 212.

Figure 8A:
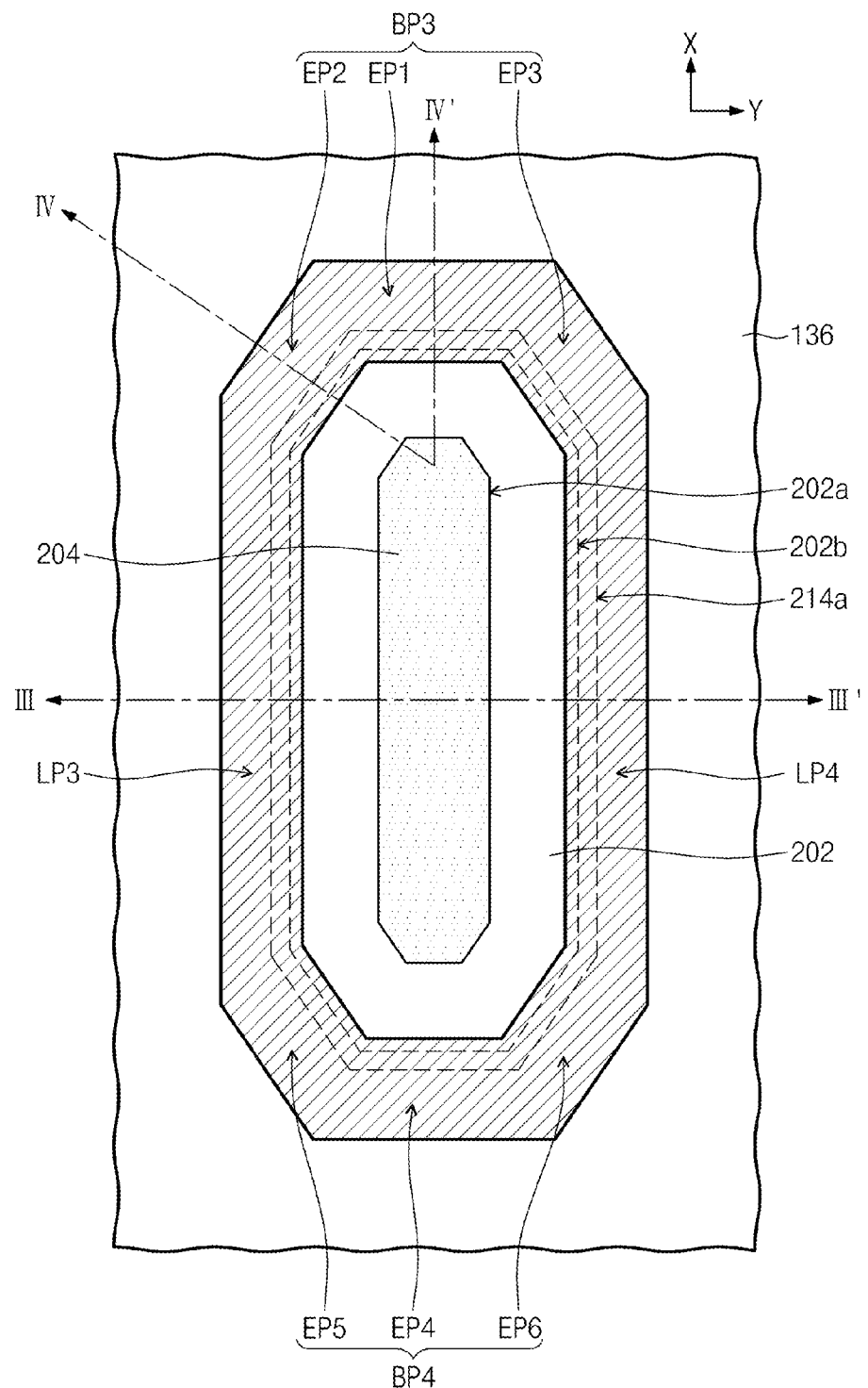
Figure 8B:
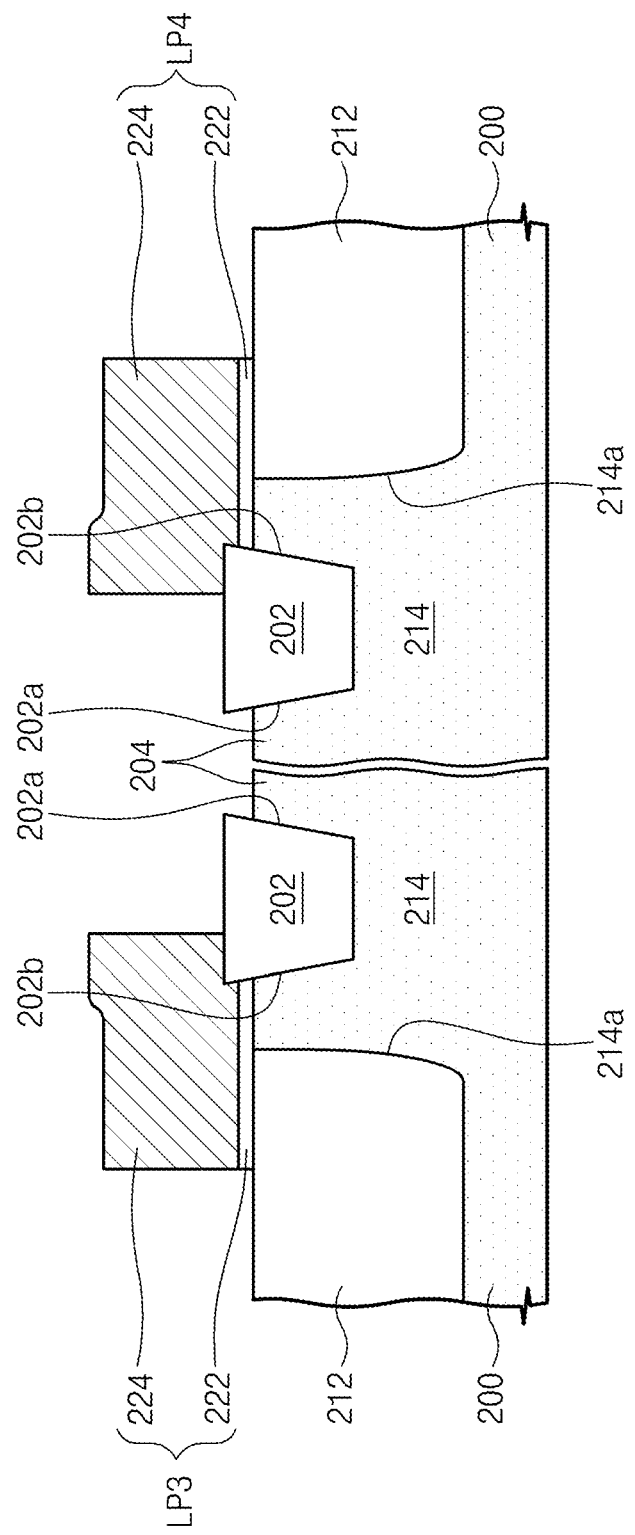

Referring to FIGS. 8A through 8C, gate pattern 222, 224 is formed on the substrate 200 by, for example, forming an insulating layer and a gate electrode layer on the substrate 200, and then patterning the insulating layer and the gate electrode layer. The patterning process forms the linear portions LP3 and LP4, and the bending portion BP3 comprising, for example, the linear first through third extensions EP1, EP2 and EP3 and the bending portion BP4 comprising, for example, the fourth through sixth extensions EP4, EP5 and EP6.

Referring back to FIGS. 6A through 6C, first source/drain region 232 is formed in the body region 212 to the outside of the gate pattern 222, 224, and the second source/drain region 234 is formed from the isolation portion 204. The first and second source/drain regions 232 and 234 may be formed at the same time. For example, the first and second source/drain regions 232 and 234 may be formed by forming a mask on the body region 212, and then implanting dopant (ions) of the second conductivity type using the mask, the gate pattern 222 and 224 and the device isolation pattern 202 as an ion implantation mask. In the illustrated example, the sidewall 232a of the first source/drain region 232 is self-aligned by this process with the outer sidewall of the gate pattern 222, 224. Alternatively, after the dopant is implanted, an activation process is performed so that the dopant diffuses under the gate pattern 222, 224 and the resulting inner side wall of the first source/drain region 232 is disposed beneath the gate pattern 222, 224 so as to be located be closer to the device isolation pattern 202 than the outer sidewall of the gate pattern 222, 224.

After removing the mask, a pick-up region 236 is formed in the body region 212 on the outer side of the first source/drain region 232. The pick-up region 236 may be formed by forming a mask over the first and second source/drain regions 232 and 234, and then implanting dopant (ions) of the first conductivity type into the body region 212 using the mask as an ion implantation mask.

A modified example of the second embodiment of a semiconductor device according to the inventive concept will now be described with reference to FIGS. 9A through 9C.

Figure 9A:
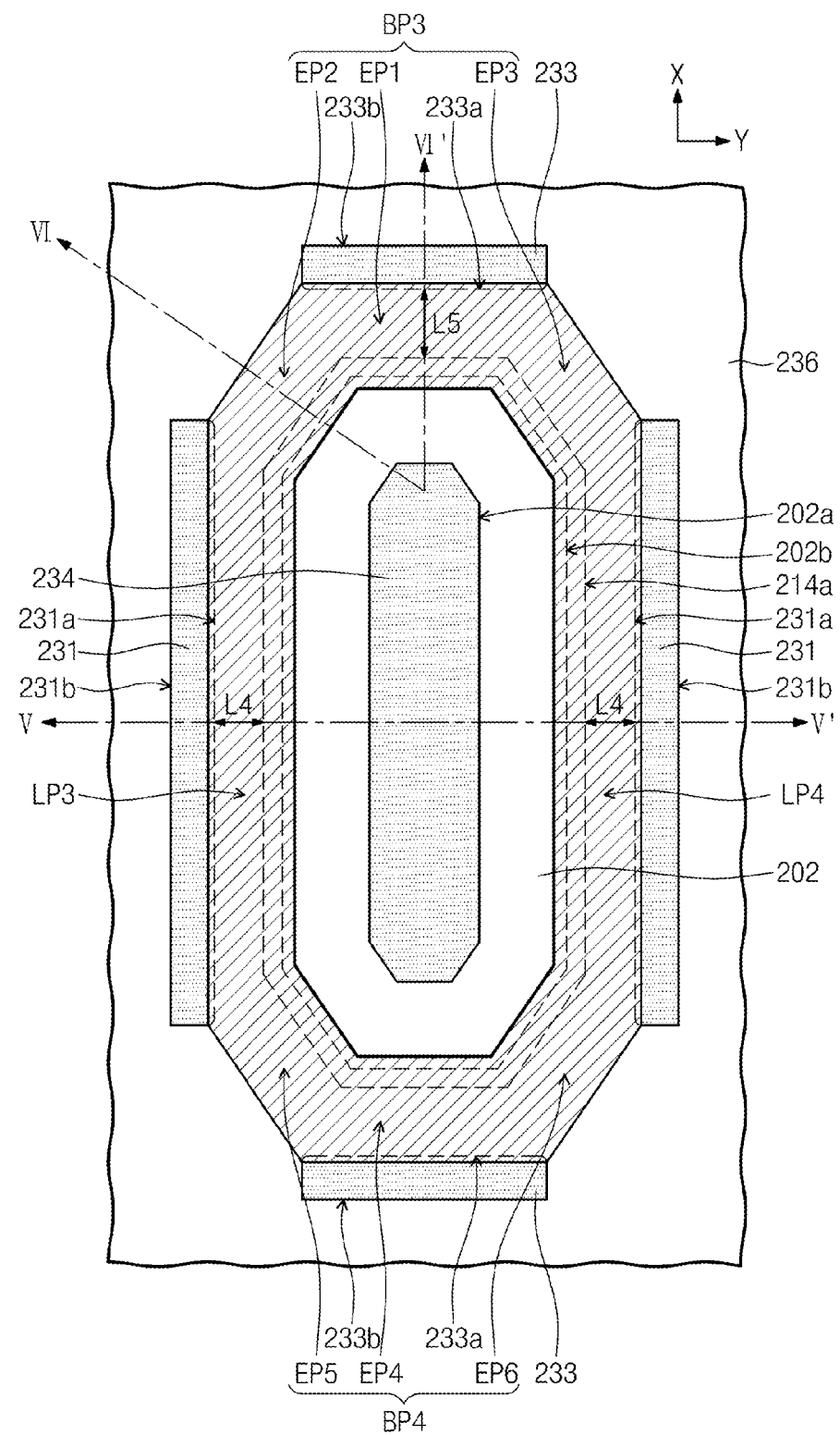
FIG. 9A is a plan view of another version of the second embodiment of a semiconductor device in accordance with the inventive concept.
Figure 9B:
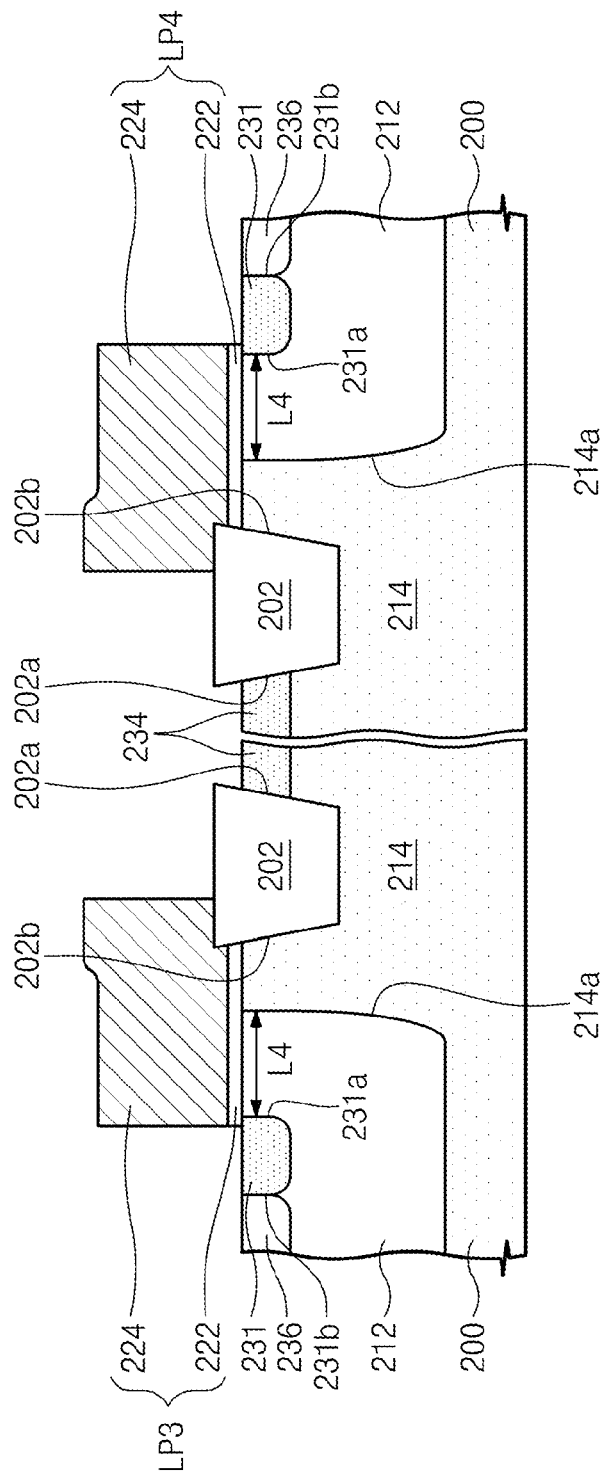
FIG. 9B is a sectional view taken along lines V-V' of FIG. 9A.
Figure 9C:
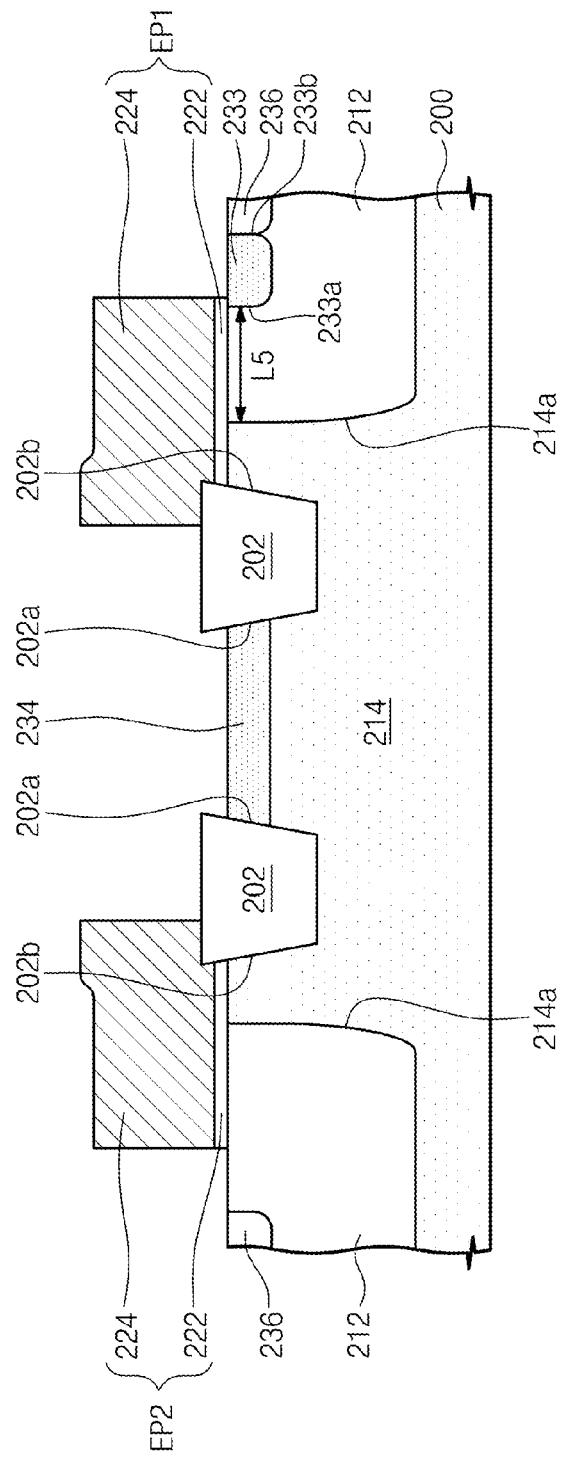
FIG. 9C is a sectional view taken along line VI-VI' of FIG. 9A.

Referring to FIGS. 9A through 9C, the substrate 200, the device isolation pattern 202, the body region 212, the drift region 214, the gate pattern 222, 224 and the second source/drain region 234 are similar to those described above with reference to FIGS. 6A through 6C. A first source/drain region 231, 233 of the second conductivity type is disposed in the body region 212 at the outer side of the gate pattern 222, 224. The first source/drain region 231, 233 has a first part 231 and a second part 233. The first part 231 is disposed in the body region 212 at the outer side of the linear portions LP3 and LP4 of the gate pattern 222, 224. The second part 233 is disposed in the body region 212 at the outer side of the first extension EP1 of the first bending portion BP3 and in the body region 212 at the outer side of the fourth extension EP4 of the second bending portion BP4. However, the first part 231 and the second part 233 are spaced apart from each other.

According to this version of a semiconductor device in accordance with the inventive concept, the first source/drain region 231, 233 is not disposed in the body region 212 to the outer side of any of the second, third, fifth and sixth extensions EP2, EP3, EP5 and EP6 but is only disposed in the body region 212 to the outer side of the first and fourth extensions EP1 and EP4. Accordingly, current hardly concentrates at the ends of the second source/drain region 234.

Figure 10A:
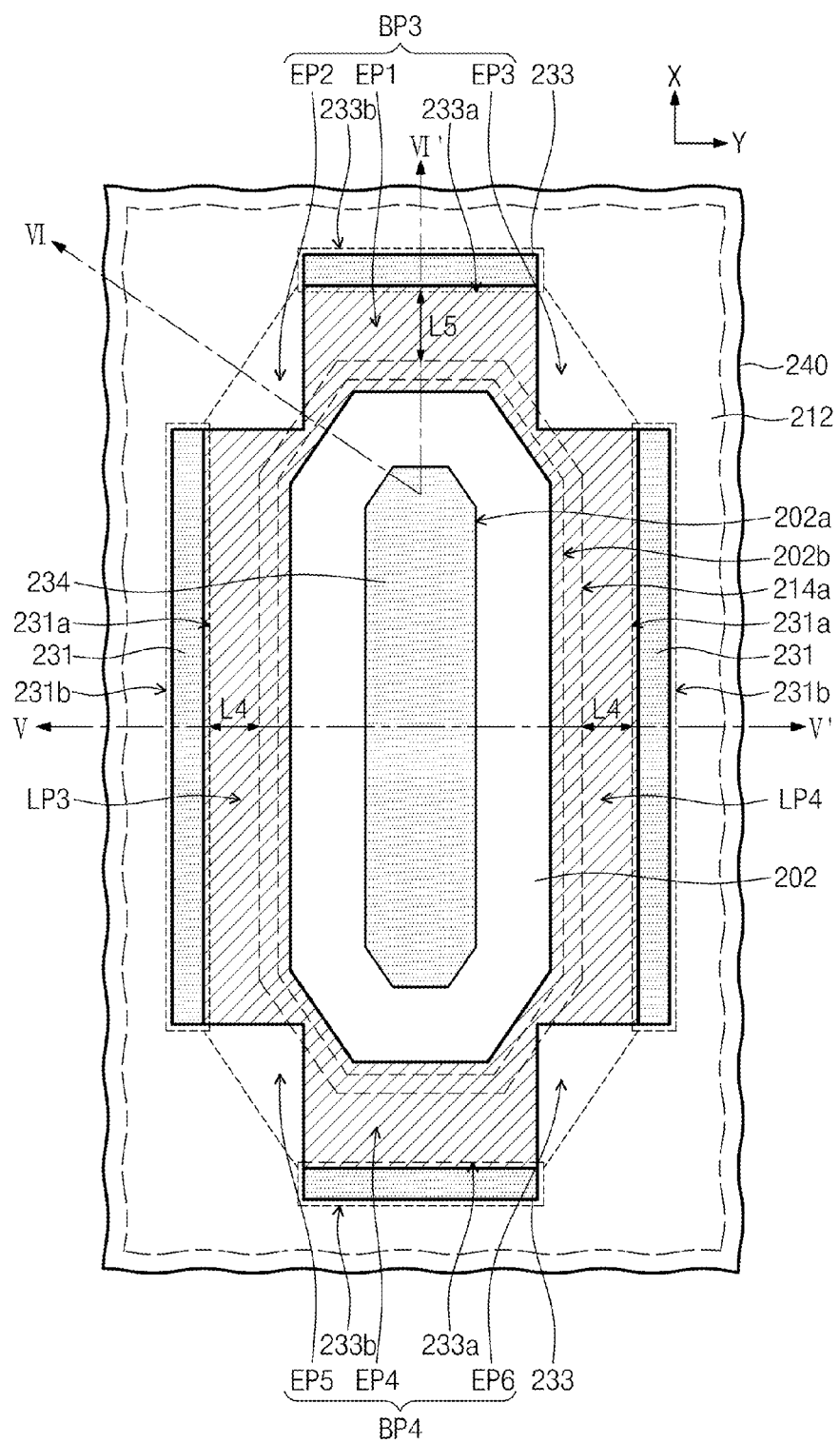
Figure 10B:
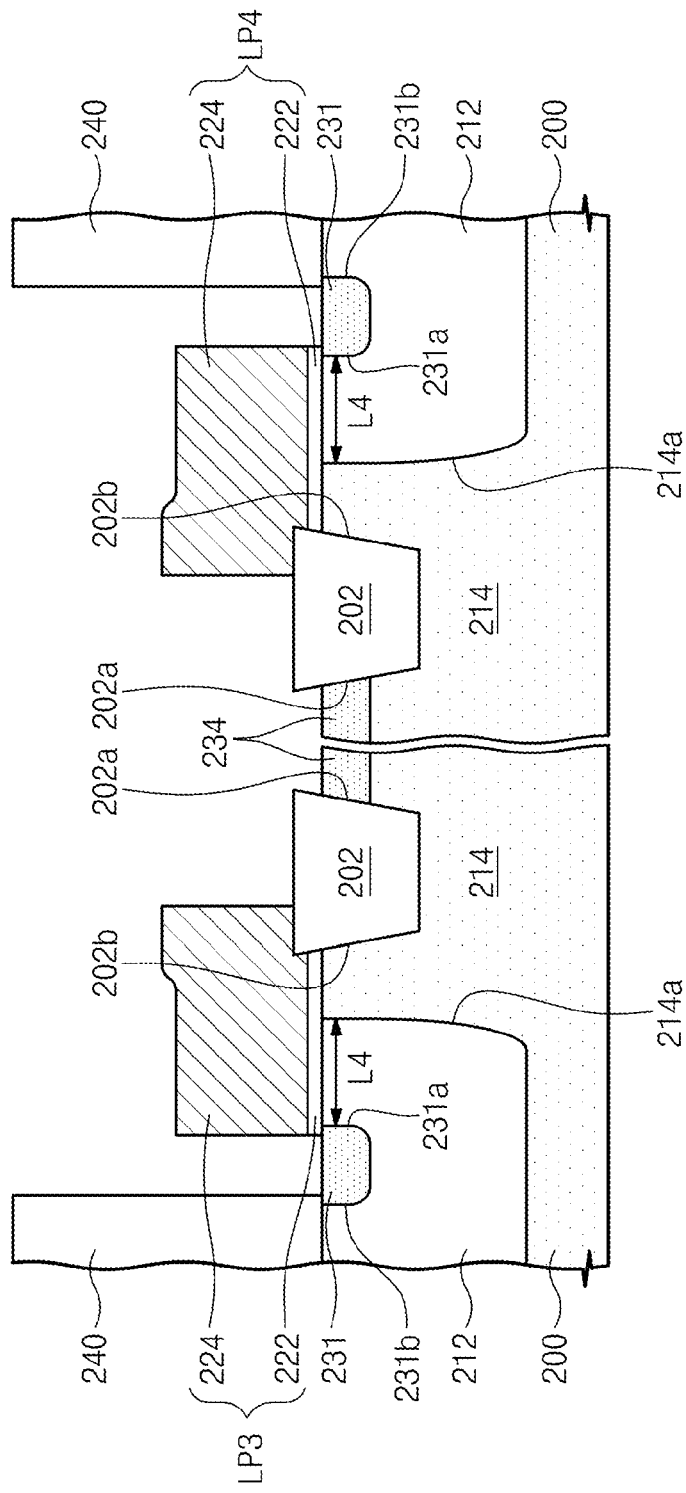

A method of manufacturing the version of the second embodiment of a semiconductor device, shown in FIGS. 9A-9C, in accordance with the inventive concept, will now be described with reference to FIGS. 10A through 10C.

First, the method is similar to that shown in and described with reference to FIGS. 7A through 7C and FIGS. 8A through 8C.

Next, a mask 240 is formed on substrate 200, and dopant (ions) of the second conductivity type is implanted into the substrate using the mask 240, the gate pattern 222, 224 and the device isolation pattern 202 as an ion implantation mask. As a result, the dopant of the second conductivity type is implanted into part of the body region 212 adjacent outer sidewalls of the linear portions LP3 and LP4, into part of the body region 212 adjacent outer sidewalls of the first and fourth extensions EP1 and EP4, and into the isolation portion 204 to form first part 231 of the first source/drain region 231 and 233, second part 233 of the first source/drain region 231 and 233 and second source/drain region 233. The mask 240 prevents the dopant of the second conductivity type from being implanted into those parts of the body region 212 adjacent to the outer sidewalls of the second, third, fifth and sixth extensions EP2, EP3, EP5 and EP6.

The remainder of the method is similar to that shown in and described above to complete the semiconductor device shown in FIGS. 9A through 9C. Briefly, pick-up region 236 is formed in the body region 212 by forming a mask that covers the first and second source/drain regions 231, 233 and 234, and then implanting dopant (ions) of the first conductivity type into the body region 212 using the mask as an ion implantation mask.

The semiconductor devices according to the inventive concept may be may be packaged in various ways. For example, semiconductor devices according to the inventive concept may be packaged in a Package on Package (PoP), Ball Grid Array (BGA) package, Chip Scale Package (CSP), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), and Wafer-level Processed Stack Package (WSP).

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A semiconductor device comprising:
   a body region in a substrate, the body region being of a first conductivity type;
   a gate pattern disposed on the body region, the gate pattern comprising a linear portion extending longitudinally in a first direction in an X-Y plane, and a bending portion extending from one end of the linear portion and bending from the first direction in the X-Y plane; and
   a channel region located beneath the gate pattern,
   wherein the linear portion of the gate pattern has a uniform width, and
   the channel of the semiconductor device has a first length in a first portion of the channel region located beneath the linear portion of the gate pattern, the first length being equal to the width of the first portion of the channel region, whereby the width of the first portion of the channel region is a first dimension thereof in a second direction perpendicular to the first direction in the X-Y plane,
   the channel of the semiconductor device has a second length in a second portion of the channel region located beneath the bending portion of the gate pattern, the second length being equal to the width of the second portion of the channel region at one point therealong, whereby the width of the second portion of the channel region is a second dimension thereof in a direction different from each of the first and second directions in the X-Y plane, and
   the second channel length is greater than the first channel length.

2. The semiconductor device of claim 1, wherein the gate pattern has a pair of the linear portions and a pair of the bending portions,
   the linear portions are spaced apart from each other in the second direction,
   one of the bending portions connects corresponding first ends of the linear portions to each other and the other of the bending portions connects corresponding second ends of the linear portions to each other such that the gate pattern has the form of a loop when viewed in plan.

3. The semiconductor device of claim 2, further comprising:
a first source/drain region in the body region at an outer side of the gate pattern, the first source/drain region being of a second conductivity type;
a drift region defined in the substrate, the drift region being surrounded by the body region and of the second conductivity type; and
a second source/drain region located in the drift region, wherein the second source/drain region is of the second conductivity type and has a higher concentration of dopant than the drift region, and
the drift region and the second source/drain region are disposed inside the gate pattern when viewed in plan.

4. The semiconductor device of claim 3, wherein each of the bending portions comprises a first extension extending linearly in the X-Y plane in the second direction, and a second extension extending linearly in the X-Y plane in a third direction different from the first and second directions, and
the second extension connects said first extension and said linear portion.

5. The semiconductor device of claim 4, wherein the first source/drain region has a first part adjacent to said first extension and a second part adjacent to said linear portion of the gate pattern,
and the first and second parts of the first source/drain region are spaced apart from each other.

6. The semiconductor device of claim 3, wherein the second source/drain region is disposed between the linear portions of the gate pattern and extends parallel to the linear portions.

7. The semiconductor device of claim 3, further comprising a device isolation pattern of insulation material in the drift region, the device isolation pattern being laterally spaced from the body region and surrounding the second source/drain region.

8. The semiconductor device of claim 7, wherein the gate pattern covers the drift region between the device isolation pattern and the body region, covers the body region between the first source/drain region and the drift region and covers at least part of the device isolation pattern.

9. The semiconductor device of claim 1, wherein the bending portion has a curvilinear form when viewed in plan.

10. The semiconductor device of claim 1, wherein the channel of the semiconductor device has a third length in the second portion of the channel region located beneath the bending portion of the gate pattern, the third length being equal to the width of the second portion of the channel region at another point spaced from said one point along the length of the second portion of the channel region, and
wherein the third channel length is different from the second channel length and greater than the first channel length.

11. A semiconductor device comprising:
a body region in a substrate and delimiting a drift region, the body region being of a first conductivity type, and the drift region being a part of the substrate surrounded by the body region and of a second conductivity type;
a first source/drain region in the body region, the first source/drain region being of the second conductivity type; and
a gate pattern disposed on the body region between the drift region and the first source/drain region,
wherein the gate pattern has a linear portion extending longitudinally in a first direction in an X-Y plane, and a bending portion extending from one end of the linear portion and bending from the first direction in the X-Y plane,
the linear portion has a uniform width, and
the shortest distance between the drift region and a first part of the first source/drain region adjacent to the linear portion is smaller than the shortest distance between the drift region and a second part of the first source/drain region adjacent to the bending portion.

12. The semiconductor device of claim 11, further comprising:
a second source/drain region in the drift region, the second source/drain region being of the second conductivity type and having a dopant concentration greater than that of the drift region; and
a device isolation pattern of insulation material in the drift region, the device isolation pattern surrounding the second source/drain region.

13. The semiconductor device of claim 11, further comprising a pick-up region in the body region and located to one side of the first source/drain region,
the one side of the first source/drain region is opposite the side of the first source/drain region that faces the drift region, and
the pick-up region is of the first conductivity type and has a dopant concentration greater than that of the body region.

14. The semiconductor device of claim 11, wherein the bending portion has a width greater than the width of the linear portion of the gate pattern.

15. A semiconductor device comprising:
a substrate having a drift region of one conductivity type, first and second source/drain regions of said one conductivity type, and a body region of the other conductivity type surrounding and delimiting the drift region, the second source/drain region being elongated in a first direction in an X-Y plane;
a device isolation layer of insulating material disposed in the drift region of the substrate and extending in a loop in the X-Y plane around the second source/drain region,
wherein part of the body region is interposed between the first source/drain region and the device isolation layer as laterally spaced outwardly from the device isolation layer, and extends in a loop in the X-Y plane around the device isolation layer, whereby part of the drift region spans the loop-shaped part of the body region and the device isolation layer; and
a gate pattern disposed on the substrate,
wherein the gate pattern has the shape of a loop in the X-Y plane and includes linear portions extending adjacent opposite sides of the second source/drain region, respectively, and bending portions extending adjacent opposite ends of the second source/drain region, respectively,
the gate pattern covers the loop-shaped part of the body region, and said part of the drift region which spans the loop-shaped part of the body region and the device isolation layer,
the linear portions of the gate pattern have uniform widths, and
each of the bending portions have widths at points therealong that are greater than the widths of the linear portions such that the gate pattern spans in its widthwise direction the loop-shaped part of the body region to a greater extent at said points along the bending portion than at any point along the linear portions.

16. The semiconductor device of claim 15, wherein each of the bending portions are curvilinear in the X-Y plane.

17. The semiconductor device of claim 15, wherein each of the bending portions is constituted by a plurality of linear segments extending longitudinally in the X-Y plane in different directions from one another.

18. The semiconductor device of claim 15, wherein the first source/drain region has first parts adjacent the linear portions of the gate pattern, respectively, and second parts adjacent the bending portions of the gate pattern, respectively, and the first parts are spaced from the second parts.

* * * * *